United States Patent
Brunner et al.

(10) Patent No.: US 12,341,488 B2
(45) Date of Patent: Jun. 24, 2025

(54) PACKAGE COMPRISING AN ACOUSTIC DEVICE AND A POLYMER CAP LAYER

(71) Applicant: QUALCOMM Incorporated, San Diego, CA (US)

(72) Inventors: Sebastian Brunner, Graz (AT); Changhan Hobie Yun, San Diego, CA (US); Stefan Leopold Hatzl, Kloech (AT); Manuel Hofer, Graz (AT); Horst Droescher, Frauental an der Laßnitz (AT); Christian Hoffmann, Bavaria (DE)

(73) Assignee: QUALCOMM INCORPORATED, San Diego, CA (US)

( * ) Notice: Subject to any disclaimer, the term of this patent is extended or adjusted under 35 U.S.C. 154(b) by 301 days.

(21) Appl. No.: 17/948,984

(22) Filed: Sep. 20, 2022

(65) Prior Publication Data

US 2024/0097648 A1    Mar. 21, 2024

(51) Int. Cl.
*H03H 9/10*    (2006.01)

(52) U.S. Cl.
CPC ........ *H03H 9/1014* (2013.01); *H03H 9/1071* (2013.01)

(58) Field of Classification Search
CPC .. H03H 9/1014; H03H 9/1071; H03H 9/0561; H03H 9/105; H03H 9/1092; H03H 3/02
USPC .................... 333/133, 186–188, 193–196
See application file for complete search history.

(56) References Cited

U.S. PATENT DOCUMENTS

| | | | |
|---|---|---|---|
| 7,378,724 B2 * | 5/2008 | Yu ..................... | H01L 27/14618 257/433 |
| 7,417,525 B2 | 8/2008 | Lee et al. | |
| 9,397,116 B2 | 7/2016 | Huang et al. | |
| 10,069,474 B2 * | 9/2018 | Yun ...................... | H05K 1/0306 |
| 10,680,159 B2 | 6/2020 | Metzger et al. | |
| 10,819,309 B1 * | 10/2020 | Turner ................... | H03H 9/25 |
| 11,088,090 B1 * | 8/2021 | Brunner ............. | H01L 23/5384 |
| 11,159,141 B2 | 10/2021 | Yamamoto et al. | |
| 11,201,127 B2 * | 12/2021 | Kim .................... | H01L 23/5385 |
| 11,244,906 B2 * | 2/2022 | Huang ................ | H01L 25/0657 |

(Continued)

FOREIGN PATENT DOCUMENTS

CN    112290901 A  *  1/2021  .......... H03H 3/0075

OTHER PUBLICATIONS

International Search Report and Written Opinion—PCT/US2023/073534—ISA/EPO—Jan. 10, 2024.

(Continued)

*Primary Examiner* — Jorge L Salazar, Jr.
(74) *Attorney, Agent, or Firm* — Loza & Loza, LLP

(57) ABSTRACT

A package comprising an acoustic device, a polymer frame coupled to the acoustic device, a plurality of frame interconnects located in the polymer frame, where the plurality of frame interconnects are coupled to the acoustic device, a polymer cap layer coupled to the acoustic device though the polymer frame, where the polymer cap layer is configured as a cap for the acoustic device, a plurality of cap interconnects located in the polymer cap layer, where the plurality of cap interconnects are coupled to the plurality of frame interconnects, and a cavity located between the acoustic device and the polymer cap layer. The acoustic device includes a substrate and an acoustic element coupled to the substrate.

30 Claims, 27 Drawing Sheets

CROSS SECTIONAL SIDE PROFILE VIEW

(56) References Cited

U.S. PATENT DOCUMENTS

| | | | |
|---|---|---|---|
| 11,581,870 B2 | 2/2023 | Takano et al. | |
| 2010/0134210 A1 | 6/2010 | Umeda | |
| 2011/0090651 A1 | 4/2011 | Jung et al. | |
| 2011/0214265 A1 | 9/2011 | Tsuda | |
| 2012/0094418 A1* | 4/2012 | Grama | B81C 1/00333 |
| | | | 438/118 |
| 2013/0337610 A1* | 12/2013 | Oda | H01L 21/78 |
| | | | 438/113 |
| 2016/0343646 A1* | 11/2016 | Alvarado | H01L 24/13 |
| 2019/0019939 A1 | 1/2019 | Park et al. | |
| 2019/0132942 A1 | 5/2019 | Yun et al. | |
| 2020/0035654 A1 | 1/2020 | Chen et al. | |
| 2020/0144985 A1* | 5/2020 | Bulger | H03H 9/1071 |
| 2021/0035929 A1 | 2/2021 | Park et al. | |
| 2021/0099149 A1* | 4/2021 | Lan | H03H 7/1741 |
| 2021/0280507 A1* | 9/2021 | Aldrete | H01L 21/568 |
| 2021/0375707 A1* | 12/2021 | Teixeira De Queiros | |
| | | | H01L 23/315 |
| 2021/0376810 A1* | 12/2021 | Kim | H03H 9/058 |
| 2021/0376816 A1* | 12/2021 | Bywalez | H03H 9/1085 |
| 2022/0246496 A1* | 8/2022 | We | H01L 24/14 |
| 2023/0101228 A1 | 3/2023 | Brunner et al. | |

OTHER PUBLICATIONS

Wang Z., "3-D Integration and Through-Silicon Vias in MEMS and Microsensors", Journal of Microelectromechanical Systems, Oct. 1, 2015, vol. 24, No. 5, XP055405155, ISSN: 1957-7157, DOI: 10.1109/JMEMS.2015.2448681, pp. 1211-1244, Section V.C., figures 11,15,23,27,43.

* cited by examiner

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

MASK REMOVAL

ENCAPSULATION FORMATION ically in cross-sectional profile view of an
exemplary package comprising an acoustic device and a
polymer cap for the acoustic device.

PACKAGE COMPRISING AN ACOUSTIC DEVICE AND A POLYMER CAP LAYER

FIELD

Various features relate to a package that includes an acoustic device.

BACKGROUND

Acoustic devices may be used for filtering out unwanted signals. For example, an acoustic device may be used to filter out signals at various frequencies, while letting through signals at a certain frequency. These acoustic devices may be implemented in a package, which may in turn be implemented in a device. As the devices have gotten smaller and smaller, there is an ongoing need to provide packages with acoustic devices with better form factors and smaller sizes.

SUMMARY

Various features relate to a package that includes an acoustic device.

One example provides a package comprising an acoustic device, a polymer frame coupled to the acoustic device, a plurality of frame interconnects located in the polymer frame, where the plurality of frame interconnects are coupled to the acoustic device, a polymer cap layer coupled to the acoustic device through the polymer frame, where the polymer cap layer is configured as a cap for the acoustic device, a plurality of cap interconnects located in the polymer cap layer, where the plurality of cap interconnects are coupled to the plurality of frame interconnects, and a cavity located between the acoustic device and the polymer cap layer. The acoustic device includes a substrate and an acoustic element coupled to the substrate.

Another example provides a device that includes an acoustic device, a polymer frame coupled to the acoustic device, a plurality of frame interconnects located in the polymer frame, where the plurality of frame interconnects are coupled to the acoustic device, a polymer cap layer coupled to the acoustic device through the polymer frame, where the polymer cap layer is configured as a cap for the acoustic device, a plurality of cap interconnects located in the polymer cap layer, where the plurality of cap interconnects are coupled to the plurality of frame interconnects, and a cavity located between the acoustic device and the polymer cap layer. The acoustic device includes a substrate and an acoustic element coupled to the substrate.

Another example provides a method for fabricating a package. The method provides an acoustic device that includes a substrate and an acoustic element coupled to the substrate. The method couples a polymer frame to the acoustic device. The method couples a polymer cap layer to the acoustic device through the polymer frame. The coupling of the polymer cap layer forms a cavity located between the acoustic device and the polymer cap layer. The polymer cap layer is configured as a cap for the acoustic device. The method forms a plurality of frame interconnects in the polymer frame, where the plurality of frame interconnects are coupled to the acoustic device. The method forms a plurality of cap interconnects in the polymer cap layer, where the plurality of cap interconnects are coupled to the plurality of frame interconnects.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising an acoustic device, a polymer frame coupled to the acoustic device, a plurality of frame interconnects located in the polymer frame, where the plurality of frame interconnects are coupled to the acoustic device, a polymer cap layer coupled to the acoustic device through the polymer frame, where the polymer cap layer is configured as a cap for the acoustic device, a plurality of cap interconnects located in the polymer cap layer, where the plurality of cap interconnects are coupled to the plurality of frame interconnects, and a cavity located between the acoustic device and the polymer cap layer. The acoustic device includes a substrate and an acoustic element coupled to the substrate. In some implementations, the package further includes an encapsulation layer coupled to the polymer cap layer and a plurality of encapsulation interconnects located at least in the encapsulation layer, where the plurality of encapsulation interconnects are coupled to the plurality of cap interconnects. At least some encapsulation interconnects from the plurality of encapsulation interconnects are configured to operate as an inductor, such as a solenoid inductor. The configuration of the package provides a package with a smaller footprint and a more compact form factor. For example, stacking the polymer cap layer over the acoustic device may reduce the footprint and/or lateral size of the package, while still providing a relatively thin package for relatively lower costs.

Exemplary Package Comprising an Acoustic Device and a Polymer Cap Layer

Figure 1:
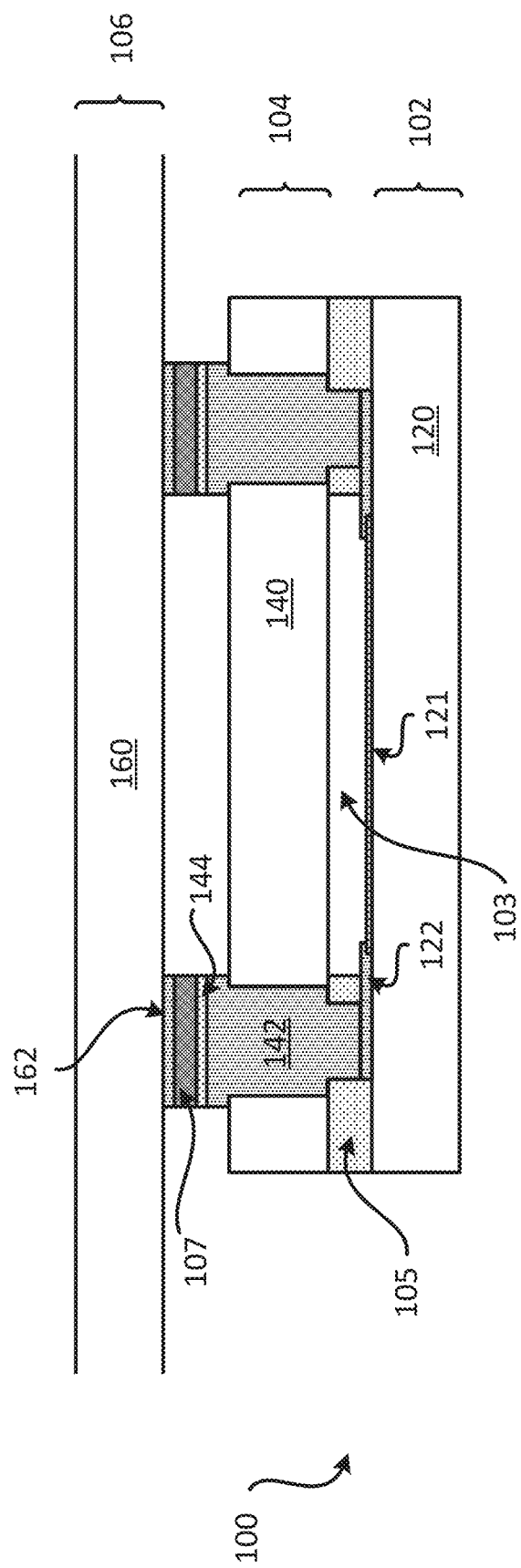
FIG. 1 illustrates a cross sectional profile view of an exemplary package comprising an acoustic device and a polymer cap for the acoustic device.

FIG. 1 illustrates a cross sectional profile view of a package 100 that includes an acoustic device and a polymer cap layer. The package 100 is coupled to a board 106 through a plurality of solder interconnects 107. The package 100 and the board 106 may be part of an assembly. In some implementations, the package 100 may be coupled to a substrate (e.g., laminate substrate, cored substrate, embedded trace substrate, interposer, package substrate).

The package 100 includes an acoustic device 102, a polymer cap layer 104 and a polymer frame 105. The polymer frame 105 is coupled to the acoustic device 102 and the polymer cap layer 104. The polymer cap layer 104 is coupled to the acoustic device 102 through the polymer frame 105. The polymer cap layer 104 is coupled to the board 106 through the plurality of solder interconnects 107. The package 100 includes a cavity 103 that is located between the acoustic device 102 and the polymer cap layer 104. The cavity 103 may be defined by at least the acoustic device 102, the polymer cap layer 104 and the polymer frame 105.

The acoustic device 102 includes a substrate 120, an acoustic element 121 and a plurality of interconnects 122. The plurality of interconnects 122 may be coupled to the acoustic element 121. The acoustic element 121 may include several acoustic elements. The substrate 120 may include a piezoelectric substrate. The substrate 120 may include a piezoelectric material. In some implementations, the substrate 120 may be entirely a piezoelectric material. In some implementations, a piezoelectric material may be formed over a surface of the substrate 120. The substrate 120 may be an acoustic device substrate. The plurality of interconnects 122 are coupled to the acoustic element 121. An example of an acoustic element includes a transducer. The acoustic device 102 may be configured to operate as a filter (e.g., RF filter). For example, the acoustic element 121 (e.g., transducer) of the acoustic device 102 may be configured to operate as a filter. When the acoustic element 121 includes several acoustic elements, the acoustic device 102 may be configured to operate as several filters. The acoustic device 102 may be configured to operate as a surface acoustic wave (SAW) filter or a bulk acoustic wave (BAW) filter. More specific examples of an acoustic device and/or a filter device is further described below in at least FIGS. 10 and 11.

The polymer cap layer 104 includes polymer layer 140 and a plurality of interconnects 142. The plurality of interconnects 142 may be located in the polymer layer 140 and over a first surface of the polymer layer 140. At least some of the interconnects from the plurality of interconnects 142 may be located in the polymer frame 105. One or more interconnects from the plurality of interconnects 142 that are located in the polymer frame 105 may be part of a plurality of frame interconnects. One or more interconnects from the plurality of interconnects that are located in the polymer layer 140 may be part of a plurality of cap interconnects. The plurality of cap interconnects may be coupled to the plurality of frame interconnects. The plurality of interconnects 142 are coupled to the plurality of interconnects 122. The polymer cap layer 104 is located between the acoustic device 102 and the board 106. The polymer cap layer 104 may be configured as a cap for the acoustic device 102. The polymer layer 140 may be configured as a cap for the acoustic element 121 of the acoustic device 102. The polymer cap layer 104 may be configured as a roof for the acoustic device 102. The polymer layer 140 may be configured as a roof for the acoustic element 121 of the acoustic device 102. The polymer cap layer 104 may be a polymer roof layer.

The polymer cap layer 104 is coupled to the acoustic device 102 such that the cavity 103 is located between the polymer cap layer 104 and the acoustic device 102. The cavity 103 may be located between the acoustic element 121 and the polymer layer 140. A cavity may be at least one region that is free of a solid material. A cavity may be occupied by a gas (e.g., air). The cavity 103 may be located over the acoustic element 121. The polymer frame 105 may laterally surround the cavity 103. The cavity 103 may be located over the acoustic element 121. In some implementations, the cavity 103 may include several cavities. For example, as will be further described below the cavity 103 may include several cavities that are defined by compartments formed and/or defined from the polymer frame 105. In some implementations, the cavity 103 may have a minimum height of about 4 micrometers. In some implementations, the cavity 103 may have a minimum height of about 8 micrometers. A height of the cavity 103 may be the distance and/or spacing between the bottom surface of the polymer layer 140 and a top surface of the acoustic device 102. A height of the cavity 103 may be the distance and/or spacing between the bottom surface of the polymer layer 140 and a top surface of the acoustic element 121 of the acoustic device 102.

As mentioned above, some interconnects from the plurality of interconnects 142 may be located in the polymer frame 105 and/or the polymer cap layer 104. The plurality of interconnects 142 may extend through the thickness of the polymer layer 140. The plurality of interconnects 142 may extend through the polymer frame 105. The plurality of interconnects 142 may be coupled to the plurality of interconnects 122. For example, the plurality of frame interconnects from the plurality of interconnects 142 may be coupled to the plurality of interconnects 122. A plurality of interconnects 144 may be coupled to the plurality of interconnects 142. For example, a plurality of interconnects 144 may be coupled to the plurality of cap interconnects from the plurality of interconnects 142. The plurality of interconnects 144 may include tin (Sn). The plurality of interconnects 144 may include silver (Ag). The plurality of interconnects 144 may include nickel (Ni). The plurality of interconnects 144 may include palladium (Pd). The plurality of interconnects 144 may include gold (Au). The plurality of interconnects 142 may include copper (Cu). The package 100 may include a seed layer (not shown) that located between the plurality of interconnects 142 and the polymer layer 140. The seed layer may be located between the plurality of interconnects 142 and the polymer frame 105. The seed layer may be located between the plurality of interconnects 142 and the plurality of interconnects 122. In some implementations, the seed layer may be considered part of the plurality of interconnects 142. The seed layer may include copper. The seed layer may include titanium.

The package 100 may include a front side and a back side. The back side of the package 100 may include the acoustic device 102. The acoustic device 102 includes a front side (e.g., side that includes the acoustic element 121) and a back side. The back side of the package 100 may include a back surface of the substrate 120 (e.g., surface of the substrate 120 that does not include the acoustic element 121, the back side of the acoustic device 102). The front side of the package 100 may include the side that includes the polymer cap layer 104.

The package 100 is coupled to the board 106 through the plurality of solder interconnects 107. The package 100 is coupled to the board 106 such that the front side of the package 100 faces towards the board 106 and the back side of the package 100 faces away from the board 106. For example, the package 100 is coupled to the board 106 such that the polymer cap layer 104 faces towards the board 106, a front side of the acoustic device 102 faces towards the board 106, and a back side of the acoustic device 102 faces away from the board 106. The board 106 may include a printed circuit board (PCB). The board 106 may include at least one board dielectric layer 160 and a plurality of board interconnects 162. In some implementations, the plurality of solder interconnects 107 are coupled to the plurality of board interconnects 162 and interconnects from the plurality of interconnects 142. In some implementations, the plurality of solder interconnects 107 are coupled to the plurality of interconnects 144. The plurality of interconnects 144 may be located between the plurality of solder interconnects 107 and the plurality of interconnects 142. In some implementations, one or more electrical signals may travel through the plurality of interconnects 144, the plurality of interconnects 142, and/or the plurality of interconnects 122.

In some implementations, the polymer frame 105 may include a different material than the polymer layer 140. Thus, both the polymer frame 105 and the polymer layer 140 may be polymers, but have different properties.

Figure 2:
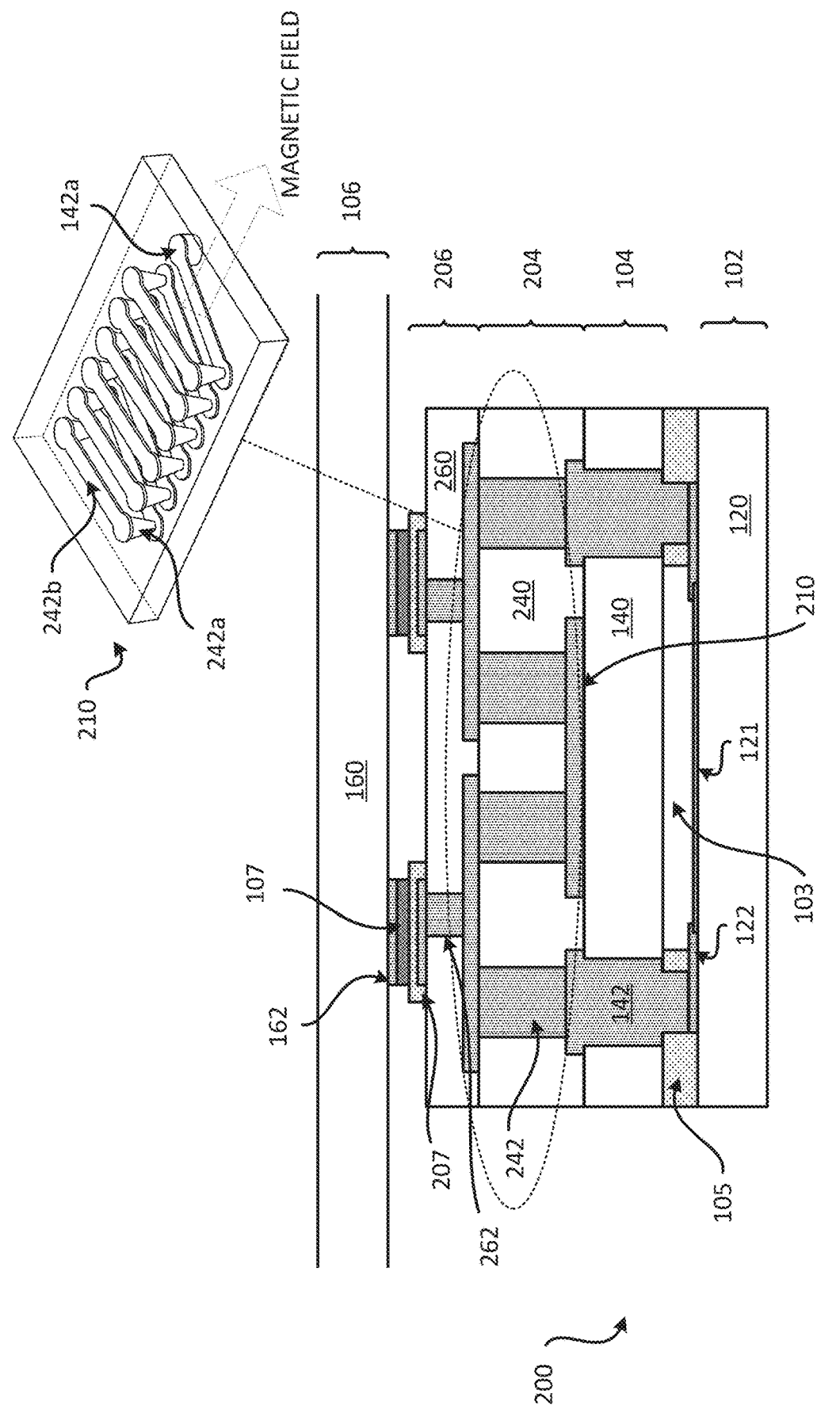
FIG. 2 illustrates a cross sectional profile view of another exemplary package comprising an acoustic device, a polymer cap for the acoustic device and an encapsulation layer with a passive device.

FIG. 2 illustrates a package 200 that includes an additional metallization portion and/or a metallization layer. The package 200 is similar to the package 100, and includes similar components configured in a similar manner as described for the package 100. The package 200 includes the acoustic device 102, the polymer frame 105, the polymer cap layer 104, the cavity 103, a metallization portion 204 and a metallization portion 206. The polymer cap layer 104 is coupled to the acoustic device 102 through the polymer frame 105. The metallization portion 204 is coupled to a surface of the polymer cap layer 104. The metallization portion 204 may be a redistribution portion.

The metallization portion 204 includes an encapsulation layer 240 and a plurality of encapsulation interconnects 242. The encapsulation layer 240 may include a mold, a resin and/or an epoxy. The encapsulation layer 240 may be a means for encapsulation. The encapsulation layer 240 may include several encapsulation layers. The encapsulation layer 240 may be provided by using a compression and transfer molding process, a sheet molding process, or a liquid molding process. The plurality of encapsulation interconnects 242 may be coupled to the plurality of interconnects 142. The plurality of encapsulation interconnects 242 may be coupled to the inductor of the polymer layer 140. For example, the plurality of encapsulation interconnects 242 may be coupled to the plurality of interconnects 142. The plurality of encapsulation interconnects 242 may include a plurality of metallization interconnects. The plurality of encapsulation interconnects 242 may include a plurality of redistribution interconnects. The plurality of encapsulation interconnects 242 are located in the encapsulation layer 240.

In some implementations, at least some encapsulation interconnects from the plurality of encapsulation interconnects 242 are configured to operate as an inductor 210. The inductor 210 may include a solenoid inductor. The inductor 210 may include and/or be defined from a plurality of interconnects 142a, a plurality of encapsulation interconnects 242a, and a plurality of encapsulation interconnects 242b. The inductor 210 may be configured to be electrically coupled to the acoustic device 102. For example, the inductor 210 may be configured to be electrically coupled to the acoustic element 121 through the plurality of interconnects 142 and the plurality of interconnects 122.

The inductor 210 is implemented such that a magnetic field generated by the inductor 210 points in a direction that is parallel to the first surface (e.g., first planar surface) and/or the second surface (e.g., first planar surface) of the polymer layer 140. This direction of the magnetic field results in the magnetic field to interfere less with the operation and performance of the acoustic element 121. However, different implementations may configure the inductor 210 differently. The inductor 210 may be configured to be a passive component (e.g., matching element) together with an acoustic device 102 (e.g., matching element for the acoustic element 121) in a filter topology.

The metallization portion 206 is coupled to a surface of the metallization portion 204. The metallization portion 206 may be a redistribution portion. The metallization portion 206 includes a dielectric layer 260 and a plurality of interconnects 262. The dielectric layer may include several dielectric layers. The dielectric layer 260 may include polymer (e.g., epoxy, polyimide). The plurality of interconnects 262 are coupled to the plurality of encapsulation interconnects 242.

The package 200 is coupled to the board 106 through a plurality of interconnects 207. The plurality of interconnects 207 may be coupled to the plurality of board interconnects 162 and the plurality of interconnects 262 of the metallization portion 206. The plurality of interconnects 207 may include a land grid array (LGA). The plurality of interconnects 207 may include a metal layer. The metallization portion 206 is located between the metallization portion 204 and the board 106. In some implementations, the package 200 may be coupled to the board 106 through a plurality of solder interconnects (e.g., 107), where the plurality of solder interconnects are located between the plurality of interconnects 207 and the plurality of board interconnects 162.

The package 200 may include a front side and a back side. The back side of the package 200 may include the acoustic device 102. The acoustic device 102 includes a front side (e.g., side that includes the acoustic element 121) and a back side. The back side of the package 200 may include a back surface of the substrate 120 (e.g., surface of the substrate 120 that does not include the acoustic element 121, the back side of the acoustic device 102). The front side of the package 200 may include the side that includes the metallization portion 206.

The package 200 is coupled to the board 106 through the plurality of interconnects 207 and the plurality of solder interconnects 107. The package 200 is coupled to the board 106 such that the front side of the package 200 faces towards the board 106 and the back side of the package 200 faces away from the board 106. For example, the package 200 is coupled to the board 106 such that the metallization portion 206 faces towards the board 106, a front side of the acoustic device 102 faces towards the board 106, and a back side of the acoustic device 102 faces away from the board 106.

Figure 3:
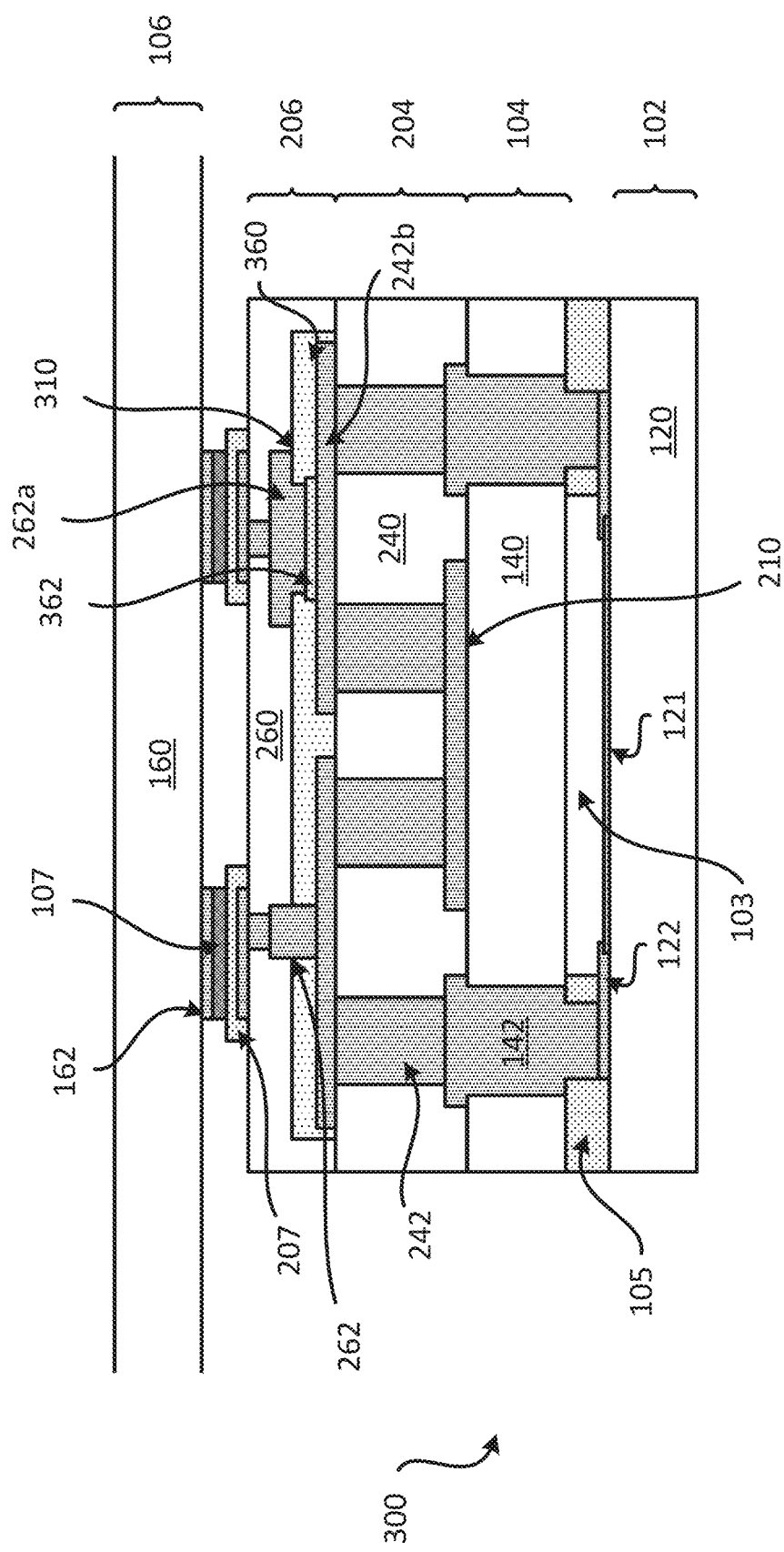
FIG. 3 illustrates a cross sectional profile view of another exemplary package comprising an acoustic device, a polymer cap for the acoustic device, an encapsulation layer with a passive device and a capacitor.

FIG. 3 illustrates a package 300 that includes an acoustic device, an inductor and a capacitor. The package 300 is similar to the package 200, and includes similar components configured in a similar manner as described for the package 200. The package 300 includes the acoustic device 102, the polymer frame 105, the polymer cap layer 104, the cavity 103, the metallization portion 204 and the metallization portion 206. The package 300 includes a capacitor 310 that is located in the metallization portion 206.

The metallization portion 206 includes a dielectric layer 360, a high K dielectric layer 362, the dielectric layer 260 and the plurality of interconnects 262. The capacitor 310 may be defined by an encapsulation interconnect 242b from the plurality of encapsulation interconnects 242, the high K dielectric layer 362 and an interconnect 262a from the plurality of interconnects 262. The dielectric layer 360 may be a similar dielectric or a different dielectric from the dielectric layer 260. The capacitor 310 is configured to be electrically coupled to the inductor 210 and the acoustic device 102.

The package 300 is coupled to the board 106 through the plurality of interconnects 207 and the plurality of solder interconnects 107. The package 300 is coupled to the board 106 such that the front side of the package 300 faces towards the board 106 and the back side of the package 300 faces away from the board 106. For example, the package 300 is coupled to the board 106 such that the metallization portion 206 faces towards the board 106, a front side of the acoustic device 102 faces towards the board 106, and a back side of the acoustic device 102 faces away from the board 106. In some implementations, the board 106 may be printed circuit board. In some implementations, the board 106 may be a substrate board (e.g., package substrate).

The polymer frame 105, the polymer layer 140, the encapsulation layer 240 may be selected based on several factors and/or considerations. For example, in some implementations, the polymer frame 105 may include a material that has high resolution for the forming via interconnects and compartments that surround the acoustic elements. The polymer frame 105 may include a material that is strong enough to keep its shape during the formation of the polymer layer 140.

In some implementations, the polymer layer 140 may include a material that has high resolution for the forming via interconnect. The polymer layer 140 may include a material that is strong enough to tent the cavity. The polymer layer 140 may include a material that has a high modulus. In some implementations, the polymer layer 140 may have a Young's Modulus (E) of about 5 gigapascal (GPA) or greater. Having a polymer of sufficient strength and/or sufficiently high Young's Modulus helps ensure that the polymer layer 140 does not collapse due to pressures from the application and/or formation of the encapsulation layer 240. This is important because during a process of forming the encapsulation layer 240, the pressure of the weight of the encapsulation layer 240 and the pressure from the process of applying the encapsulation layer 240 may cause the polymer layer 140 to collapse, which would result in the cavity 103 being deformed and/or non-existent. The polymer layer 140 may include a material that has good adhesion to the polymer frame 105. In some implementations, the polymer frame 105 and/or the polymer layer 140 includes a material that is different from glass, prepreg and/or polyimide. In some implementations, the polymer frame 105 and/or the polymer layer 140 is free of glass, prepreg and/or polyimide.

In some implementations, the encapsulation layer 240 may include a dielectric that has good electrical resistivity and has high permeability. In some implementations, the encapsulation layer 240 may include a ferrite ceramic as filler.

Figure 4:
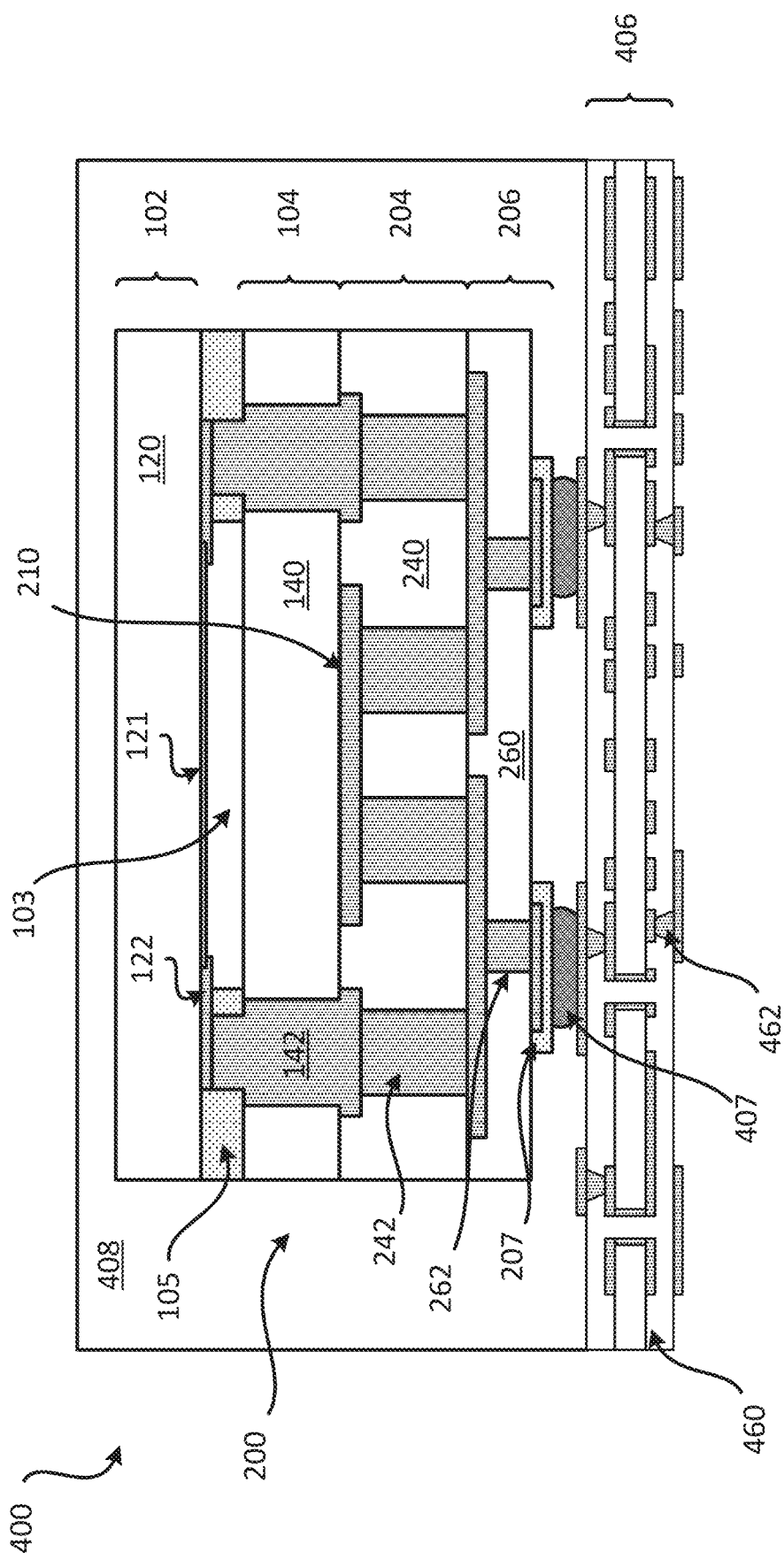
FIG. 4 illustrates a cross sectional profile view of another exemplary package comprising a substrate, an acoustic device, a polymer cap for the acoustic device and an encapsulation layer with a passive device.
Figure 5:
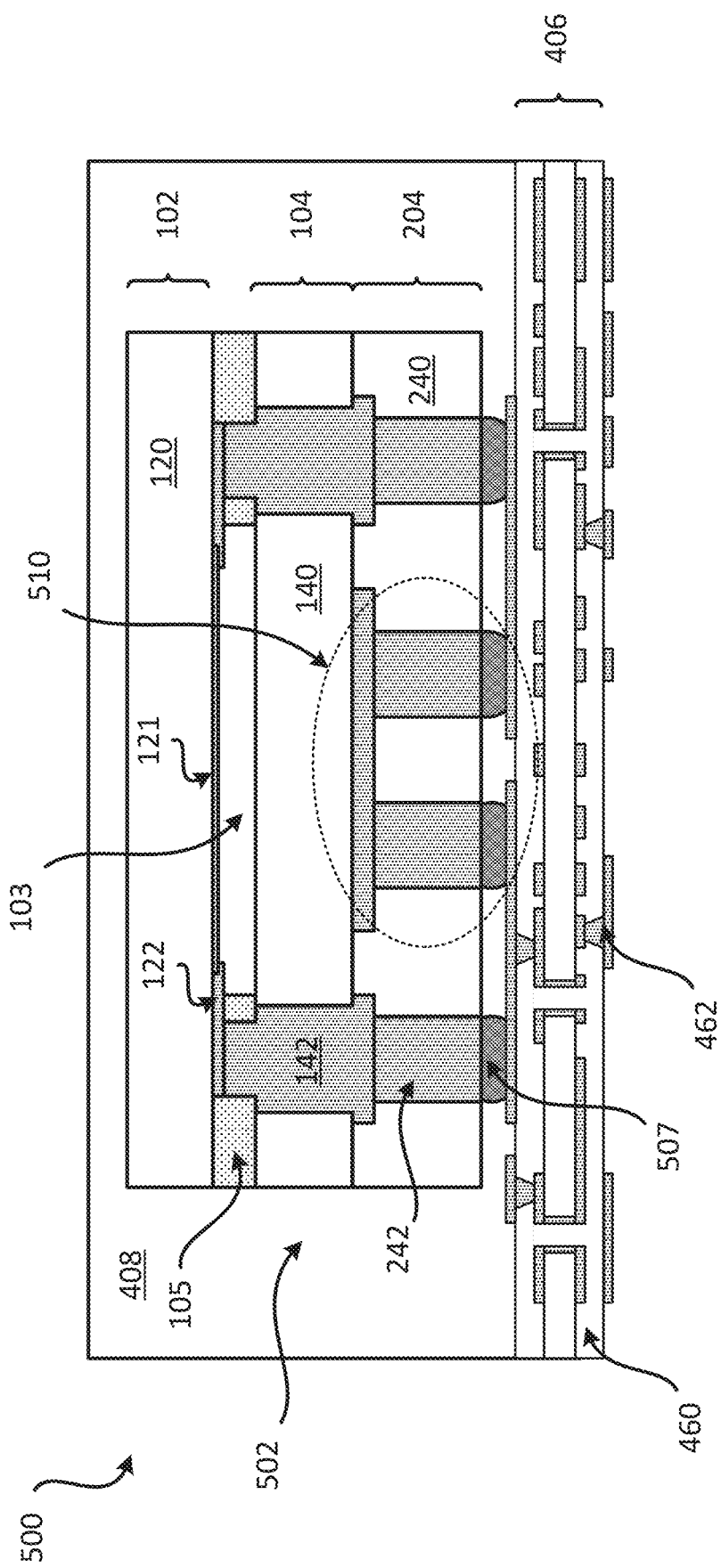
FIG. 5 illustrates a cross sectional profile view of another exemplary package comprising a substrate, an acoustic device, a polymer cap for the acoustic device and an encapsulation layer with a passive device.
Figure 6:
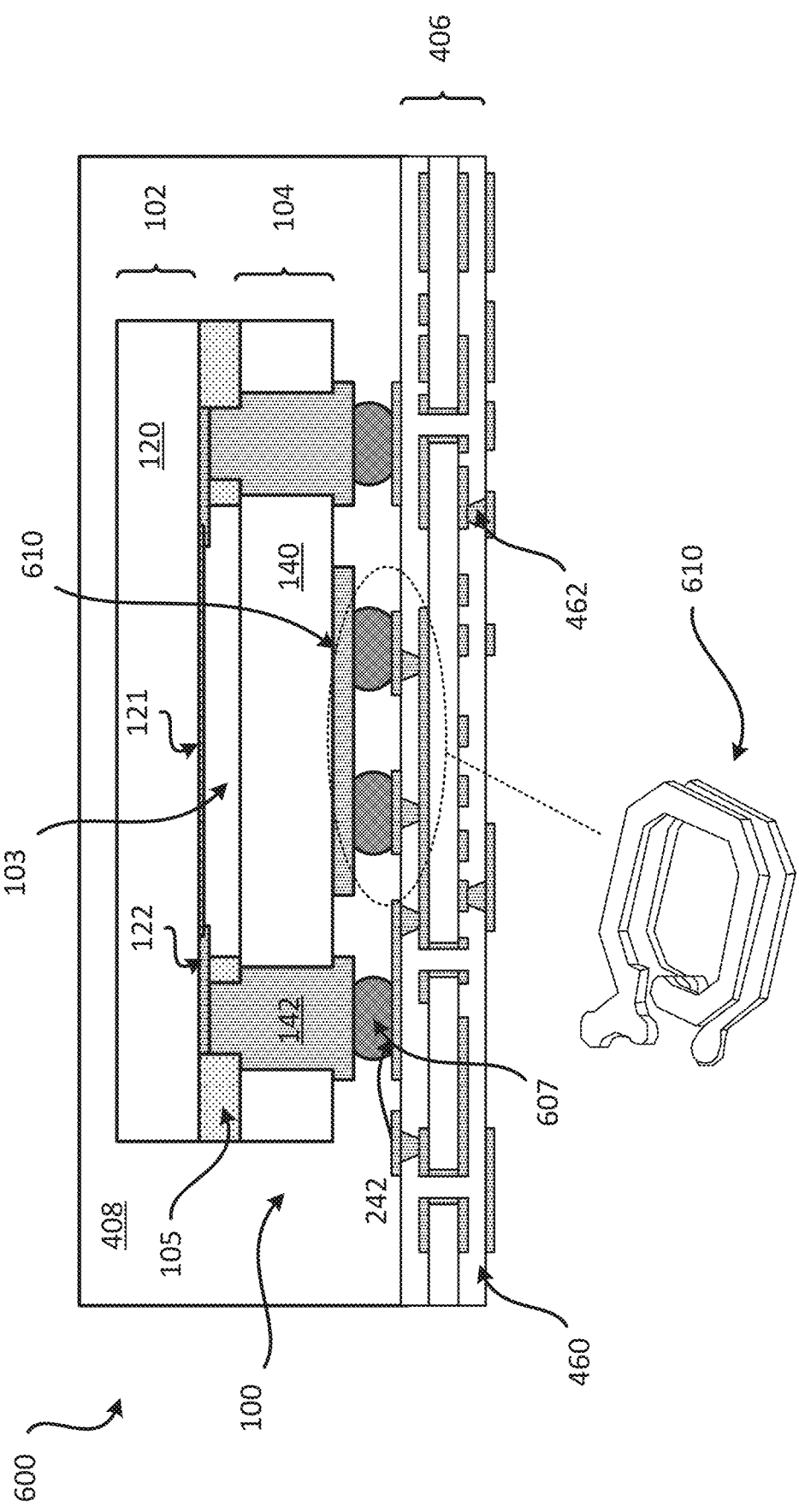
FIG. 6 illustrates a cross sectional profile view of another exemplary package comprising a substrate, an acoustic device, a polymer cap for the acoustic device.

In some implementations, an acoustic device and a polymer cap layer may be implemented as part of a package that includes an encapsulation layer and a substrate. FIGS. 4-6 illustrate examples of a package with an encapsulation layer and a substrate.

FIG. 4 illustrates a package 400 that includes a substrate 406, the package 200 and the encapsulation layer 408. The package 200 is similar to the package 200, as described in at least FIG. 2. The package 200 is coupled to the substrate 406 through a plurality of solder interconnects 407. The encapsulation layer 408 is coupled to the substrate 406 and the package 200. The encapsulation layer 408 encapsulates the package 200. The encapsulation layer 408 may include a mold, a resin and/or an epoxy. The encapsulation layer 408 may be a means for encapsulation. The encapsulation layer 408 may include several encapsulation layers. The encapsulation layer 408 may be provided by using a compression and transfer molding process, a sheet molding process, or a liquid molding process. The substrate 406 includes at least one dielectric layer 460 and a plurality of substrate interconnects 462. The at least one dielectric layer 460 may include a core layer. The substrate 406 may be a package substrate. It is noted that instead of the package 200, the package 400 may include the package 100 or the package 300.

FIG. 5 illustrates a package 500 that includes the substrate 406, a package 502 and the encapsulation layer 408. The package 502 is similar to the package 200, as described in at least FIG. 2. The package 502 includes components that are arranged and/or configured in a similar manner as the package 200. The package 502 includes the acoustic device 102, the polymer frame 105, the polymer cap layer 104 and the metallization portion 204. The package 502 is coupled to the substrate 406 through a plurality of solder interconnects 507. In particular, the plurality of encapsulation interconnects 242 of the metallization portion 204 are coupled to the substrate 406 through the plurality of solder interconnects 507. The encapsulation layer 408 is coupled to the substrate 406 and the package 502. The encapsulation layer 408 encapsulates the package 502. The substrate 406 includes at least one dielectric layer 460 and a plurality of substrate interconnects 462. The at least one dielectric layer 460 may include a core layer. The substrate 406 may be a package substrate. The package 500 includes an inductor 510. The inductor 510 may be defined from interconnects from the package 502 (e.g., interconnects from the plurality of interconnects 142, encapsulation interconnects from the plurality of encapsulation interconnects 242), solder interconnects from the plurality of solder interconnects 507 and substrate interconnects from the plurality of substrate interconnects 462. The inductor 510 may be configured as a solenoid inductor. It is noted that instead of the package 502, the package 500 may include the package 100, the package 200 or the package 300.

FIG. 6 illustrates a package 600 that includes the substrate 406, the package 100 and the encapsulation layer 408. The package 100 is similar to the package 100, as described in at least FIG. 1. The package 100 is coupled to the substrate 406 through a plurality of solder interconnects 607. In particular, the plurality of interconnects 142 of the polymer cap layer 104 are coupled to the substrate 406 through the plurality of solder interconnects 607. The encapsulation layer 408 is coupled to the substrate 406 and the package 100. The encapsulation layer 408 encapsulates the package 100. The substrate 406 includes at least one dielectric layer 460 and a plurality of substrate interconnects 462. The at least one dielectric layer 460 may include a core layer. The substrate 406 may be a package substrate. The package 600 includes an inductor 610. The inductor 610 may be defined from interconnects from the package 100 (e.g., interconnects from the plurality of interconnects 142), solder interconnects from the plurality of solder interconnects 607 and substrate interconnects from the plurality of substrate interconnects 462. It is noted that instead of the package 100, the package 600 may include the package 200 or the package 300.

In some implementations, the inductance and/or quality factor of the inductor may be improved by providing and/or forming a magnetic material within the windings of the inductor.

Figure 7:
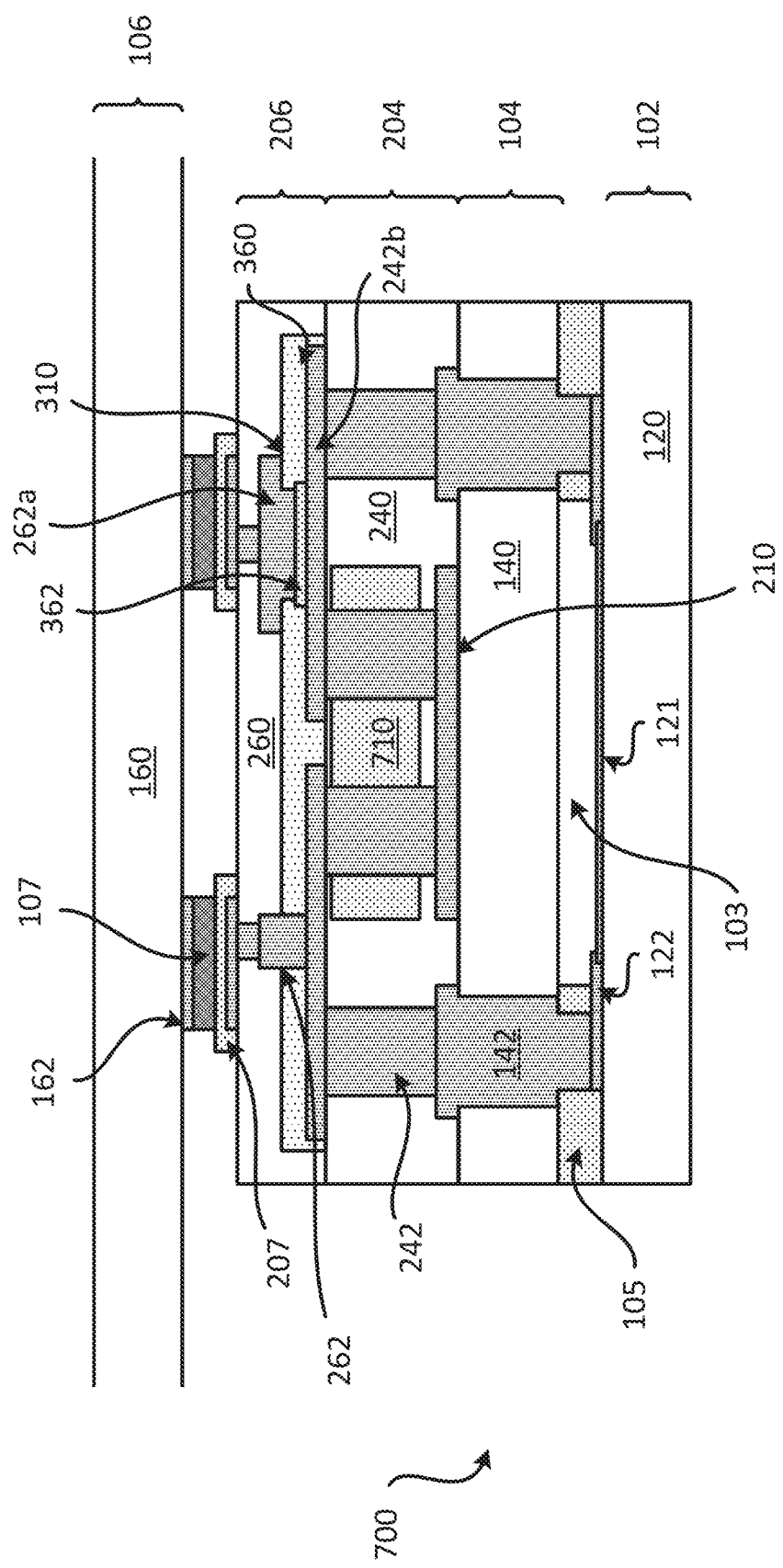
FIG. 7 illustrates a cross sectional profile view of another exemplary package comprising a substrate, an acoustic device, a polymer cap for the acoustic device and a magnetic material.

FIG. 7 illustrates a package 700 that includes a magnetic material within the windings of an inductor located in the package. The package 700 is similar to the package 300, as described in FIG. 3. The package 700 includes components that are arranged and/or configured in a similar manner as the package 300. The package 700 includes the acoustic device 102, the polymer frame 105, the polymer cap layer 104, the metallization portion 204 and the metallization portion 206 and a magnetic inlay 710. The magnetic inlay 710 includes a magnetic material. The magnetic inlay 710 is located in the metallization portion 204. The magnetic inlay 710 may be surrounded by interconnects from the inductor 210. It is noted that the magnetic inlay 710 may implemented in a similar manner in any of the packages described in the disclosure. The magnetic inlay 710 may include a solid ferromagnetic inlay. However, other materials may be used for the magnetic inlay 710.

The magnetic inlay 710 may include one or more magnetic layers and/or one or more magnetic materials. The magnetic inlay 710 includes an insulating layer, a dielectric layer and/or a non-electrical conducting material (e.g., material that does not electrically conduct). The magnetic inlay 710 may be both a dielectric material and a magnetic material. Thus, the at least one magnetic inlay 710 may have both dielectric properties and magnetic properties. The magnetic inlay 710 may include one or more materials. The magnetic inlay (e.g., magnetic material) has a permeability value that is greater than 1 (e.g., about 10 or greater, range of 6-12). The magnetic inlay may have different permeability values at different frequencies. The permeability value of a magnetic material and/or a magnetic inlay, as described in the disclosure is a relative permeability value that is defined as a ratio of the permeability of a material to the permeability of free space. Thus, the permeability values that are described for the magnetic materials and/or magnetic inlay that are illustrated and/or described in the disclosure may represent a relative permeability value that is relative to a defined permeability value (e.g., reference permeability value) of free space. In some implementations, free space may be defined to have a defined permeability value of $\mu_0 = 4\pi \times 10^{-7}$ H/m (Henry per meter). A material that has a relative permeability value that is greater than 1 may be considered to be a magnetic material.

In some implementations, an acoustic device 102 may include several acoustic elements 121. To improve the performance of one or more acoustic elements 121, one or more acoustic elements can be compartmentalized in their own space. For example, the polymer frame 105 may be used to form compartments that laterally surround one or more acoustic elements.

Figure 8:
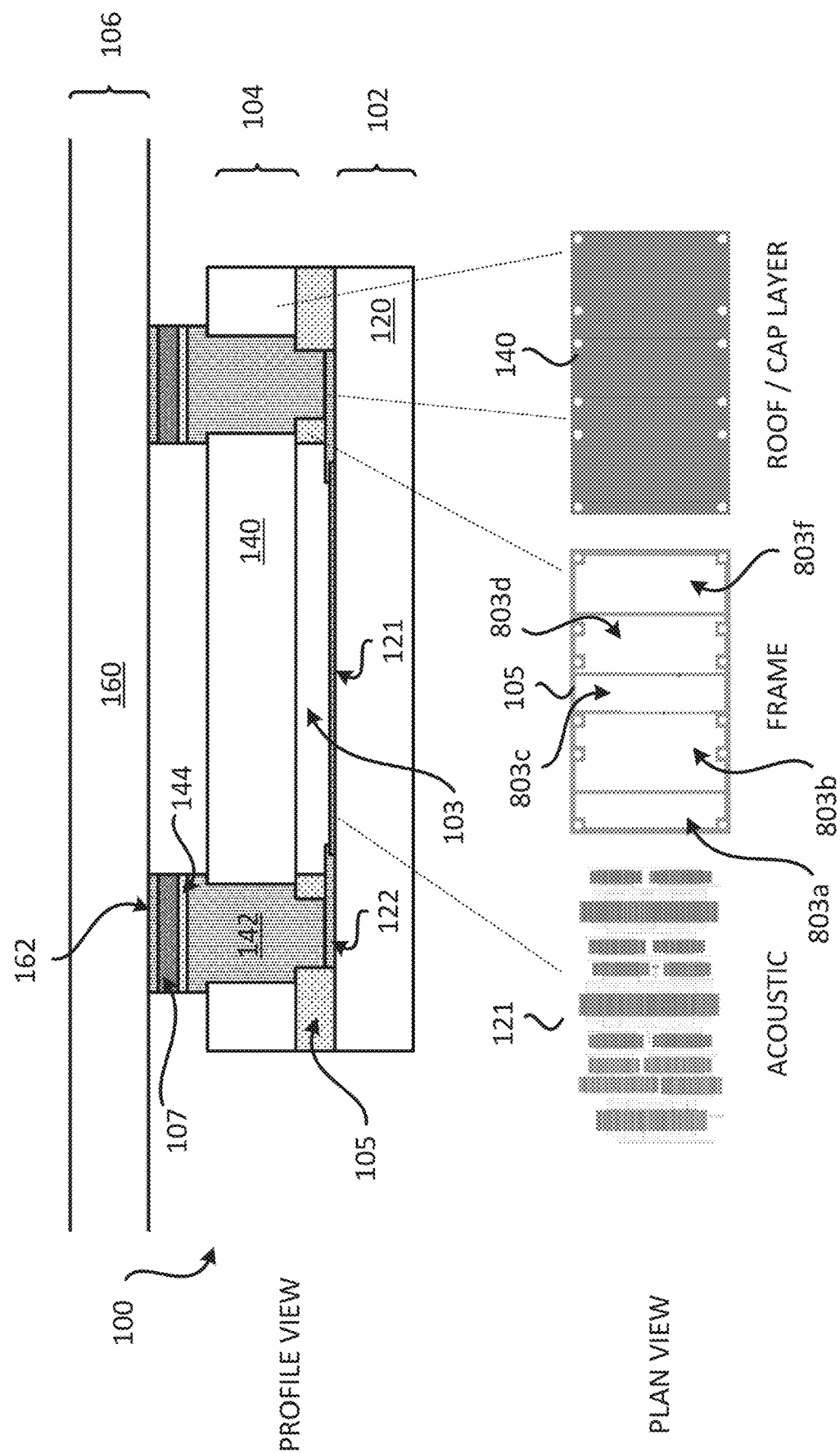
FIG. 8 illustrates a view of an exemplary package comprising a substrate, an acoustic device, a polymer cap for the acoustic device.

FIG. 8 illustrates how the polymer frame 105 can be formed to provide compartments that each laterally surround one or more acoustic elements 121. FIG. 8 illustrates a compartment 803*a*, a compartment 803*b*, a compartment 803*c*, a compartment 803*d*, and a compartment 803*e* that are defined by the polymer frame 105. Each particular compartment may define a particular cavity. Thus, the cavity 103 shown in FIG. 8, may include several cavities that are each located in a particular compartment. One or more of the acoustic elements 121 may be located in a particular compartment. Some compartments may include one acoustic element. Some compartments may include several acoustic elements.

Figure 9:
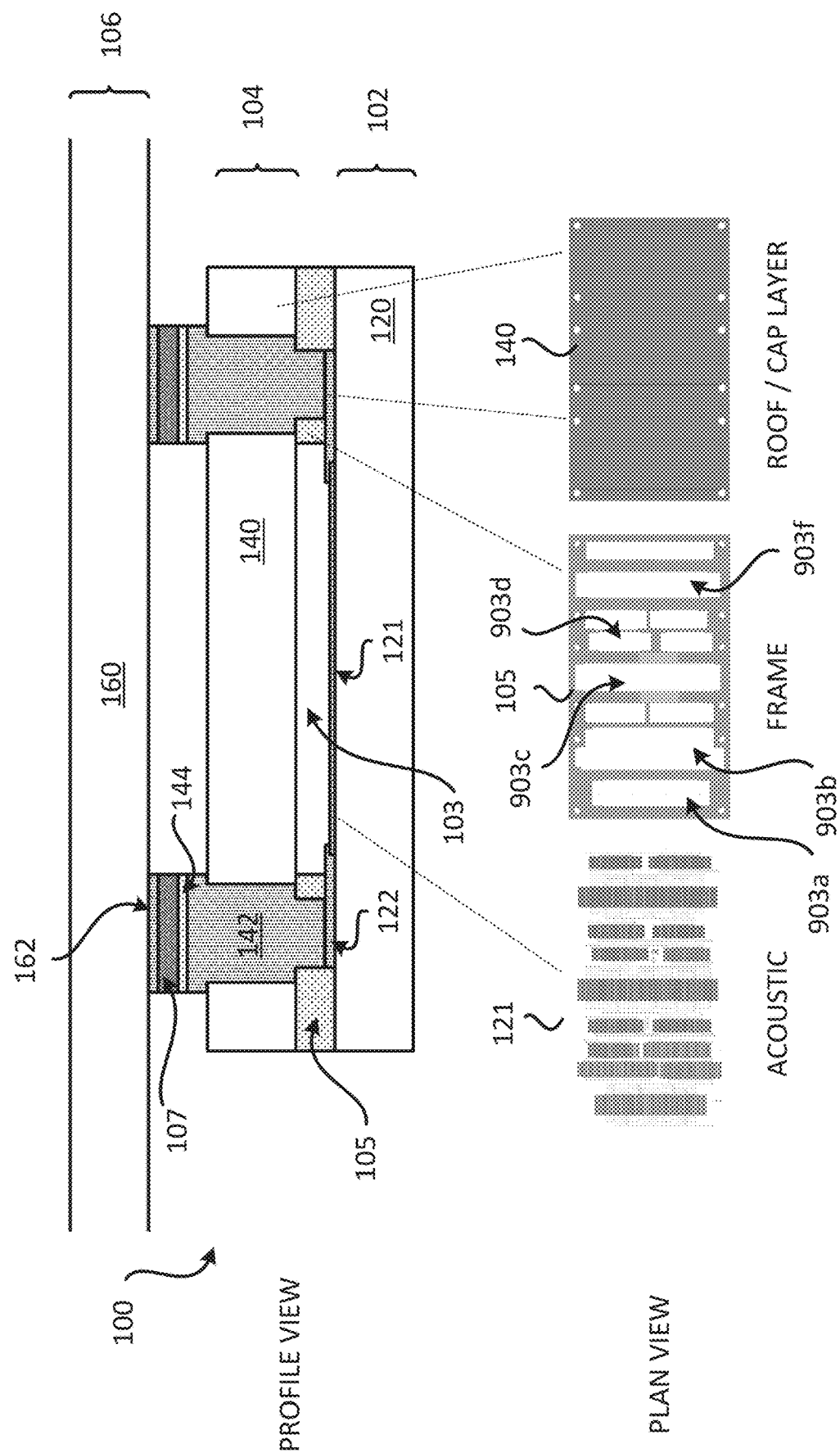
FIG. 9 illustrates a view of an exemplary package comprising a substrate, an acoustic device, a polymer cap for the acoustic device.

FIG. 9 illustrates another example of how the polymer frame 105 can be formed to provide compartments that each laterally surround one or more acoustic elements 121. FIG. 9 illustrates a compartment 903*a*, a compartment 903*b*, a compartment 903*c*, a compartment 903*d*, and a compartment 903*e* that are defined by the polymer frame 105. The compartments shown in FIG. 9 are designed to more closely follow the contours of an acoustic element than the compartments shown in FIG. 8. Each particular compartment may define a particular cavity. Thus, the cavity 103 shown in FIG. 9, may include several cavities that are each located in a particular compartment. One or more of the acoustic elements 121 may be located in a particular compartment. Some compartments may include one acoustic element. The compartments may help isolate one acoustic element from one or more acoustic elements of the acoustic device. Over each compartment there may be a polymer cap layer 104.

The packages (e.g., 100, 200, 300, 400, 500, 600, 700) provide a compact package that can be configured to a filter. The packages may be small enough to be implemented in very small devices, while still providing effective and efficient filtering of signals. This may be achieved by using a polymer cap that is implemented with an inductor. Moreover, the polymer cap layer 104 and/or the metallization portions (e.g., 204, 206) may be configured to provide one or more electrical paths for a signal to travel between the acoustic device 102 and the board 106. Thus, the polymer cap layer 104 and/or the metallization portions (e.g., 204, 206) provide multiple functionalities for the package (e.g., 100, 200, 300, 400, 500, 600, 700).

In some implementations, the substrate 120 may include silicon (Si). The plurality of interconnects 142, the plurality of encapsulation interconnects 242, the plurality of interconnects 262 and/or the plurality of interconnects 122 may include a seed layer. The polymer frame 105 may be configured to create a frame that laterally surrounds and/or defines the cavity 103. The polymer frame 105 may be configured to create a frame that laterally surrounds the acoustic element 121.

Figure 10:
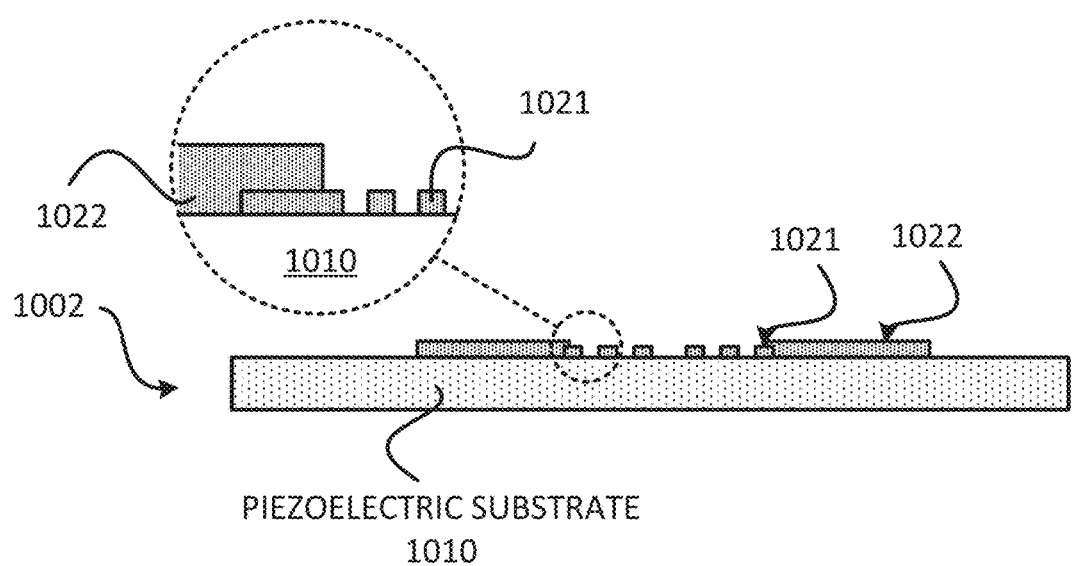
FIG. 10 illustrates a cross sectional profile view of an exemplary acoustic device.
Figure 11:
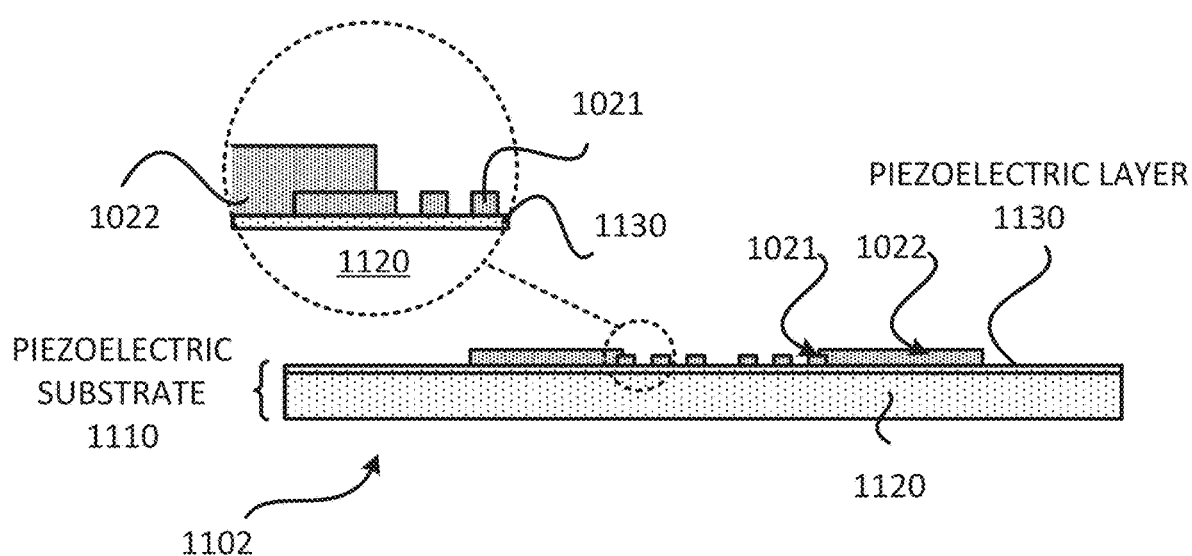
FIG. 11 illustrates a cross sectional profile view of another exemplary acoustic device.

FIGS. 10 and 11 illustrate cross sectional profile views of several exemplary acoustic devices. The various acoustic devices may be configured as filters (e.g., signal filters, radio frequency (RF) filters).

FIG. 10 illustrates an acoustic device 1002 that includes a substrate 1010, an acoustic element 1021 and a plurality of interconnects 1022. The acoustic device 1002 may represent the acoustic device 102. The substrate 1010 may be a piezoelectric substrate. The substrate 1010 may include a piezoelectric material (e.g., Aluminum Nitride (AlN), Lithium Niobate, Lithium Tantalate).

The acoustic element 1021 and the plurality of interconnects 1022 may be formed over and coupled to the substrate 1010. The acoustic element 1021 and the plurality of interconnects 1022 may be defined from at least one metal layer (e.g., electrically conductive material), such as Aluminum (Al), Molybdenum (Mo), and/or copper (Cu). The metal layer(s) may be patterned and/or configured as interconnects, electrodes and/or transducers for the acoustic device 1002. The acoustic element 1021 may include a first metal layer, and the plurality of interconnects 1022 may include a second metal layer. The first metal layer may be thinner than the second metal layer. The first metal layer may be configured to operate as at least one acoustic element 1021 (e.g., transducer), and the second metal layer may be configured as a plurality of interconnects 1022 coupled to the acoustic element (e.g., transducer). In another example, the piezoelectric substrate may include a substrate and a piezoelectric layer that is formed and located over a surface of the substrate.

FIG. 11 illustrates an acoustic device 1102 that includes a substrate 1110, an acoustic element 1021 and a plurality of interconnects 1022. The acoustic device 1102 may represent the acoustic device 102. The substrate 1110 may be a piezoelectric substrate. The substrate 1110 may include a substrate 1120 and a piezoelectric layer 1130 located over a surface of the substrate 1120. The substrate 1120 may include silicon (Si). The substrate 1110 may include a piezoelectric material (e.g., Lithium Niobate, Lithium Tantalate). For example, the piezoelectric layer 1130 may include Aluminum Nitride (AlN), Lithium Niobate, and/or Lithium Tantalate. The acoustic element 1021 is located over the piezoelectric layer 1130. Similarly, the plurality of interconnects 1022 is located over the piezoelectric layer 1130.

A piezoelectric substrate as used in the disclosure may mean a substrate that includes a piezoelectric material (e.g., as shown in the acoustic device 1002) and/or a substrate that includes a piezoelectric layer coupled to and located over a surface of the substrate (e.g., as shown in the device 1102). Different implementations may use different materials for the piezoelectric material and/or the piezoelectric layer.

Any acoustic device (e.g., 102) described in the disclosure may be implemented as the acoustic device 1002 and/or the acoustic device 1102. The acoustic devices (e.g., 1002, 1102) may be implemented as a micro-electromechanical system (MEMS) device. The acoustic devices (e.g., 1002, 1102) may be implemented as a die (e.g., bare die). The acoustic devices 1002 and/or 1102 may be configured as acoustic wave (SAW) filters. The acoustic devices 1002 and/or 1102 may be configured as bulk acoustic wave (BAW) filters. The acoustic device (e.g., 1002, 1102) may be means for signal filtering and/or means for signal extraction. Signal filtering may include signal extraction.

Having describes various packages with an acoustic device and a passive device, a sequence for fabricating an acoustic device will now be described below.

Exemplary Sequence for Fabricating an Acoustic Device

Figure 12:
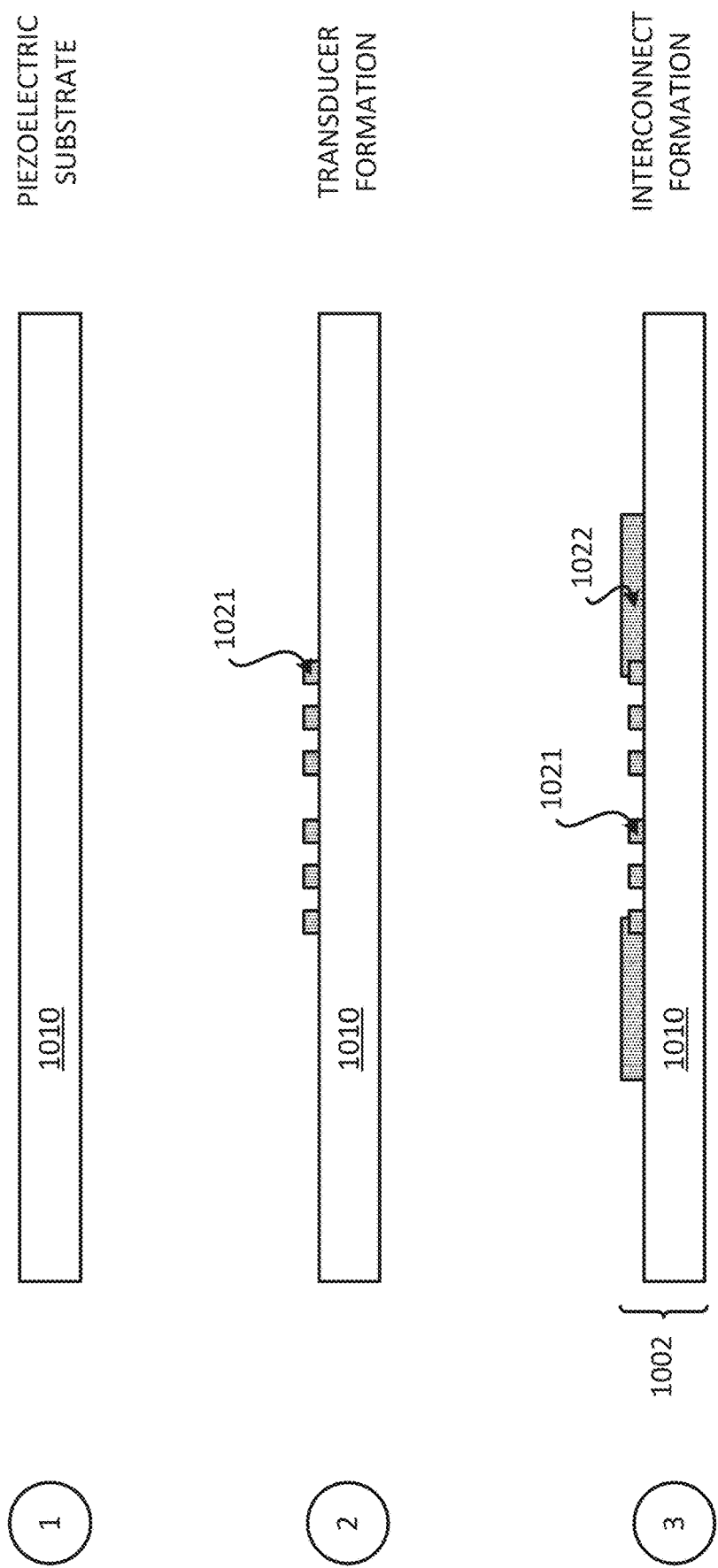
FIG. 12 illustrates an exemplary sequence for fabricating an acoustic device.

In some implementations, fabricating an acoustic device includes several processes. FIG. 12 illustrates an exemplary sequence for providing or fabricating an acoustic device. In some implementations, the sequence of FIG. 12 may be used to provide or fabricate the acoustic device 1002 of FIG. 10. However, the process of FIG. 12 may be used to fabricate any of the acoustic devices described in the disclosure.

It should be noted that the sequence of FIG. 12 may combine one or more stages in order to simplify and/or clarify the sequence for providing or fabricating an acoustic device. In some implementations, the order of the processes may be changed or modified. In some implementations, one or more of processes may be replaced or substituted without departing from the spirit of the disclosure.

Stage 1, as shown in FIG. 12, illustrates a state after a substrate 1010 is provided. The substrate 1010 may be a piezoelectric substrate. The substrate 1010 may include a piezoelectric material. In some implementations, the substrate 1010 includes silicon (Si). Different implementations may use different material may be used for the piezoelectric material (e.g., Lithium Niobate, Lithium Tantalate).

Stage 2 illustrates a state after the acoustic element 1021 is formed over the substrate 1010. The acoustic element 1021 may be defined by forming and patterning at least one metal layer over the substrate 1010. A patterning (masking) and an evaporation (or plating) process may be used to form the at least one metal layer, which may define the acoustic element 1021. The acoustic element 1021 may include a transducer.

Stage 3 illustrates a state after a plurality of interconnects 1022 is formed over the substrate 1010. The plurality of interconnects 1022 may be coupled to the acoustic element 1021. The plurality of interconnects 1022 may be defined by forming and patterning at least one metal layer over the substrate 1010. A patterning (masking) and an evaporation (or a plating) process may be used to form the at least one metal layer, to form the plurality of interconnects 1022. Stage 3 may illustrate the acoustic device 1002 that includes the substrate 1010, the acoustic element 1021 and the plurality of interconnects 1022.

Exemplary Sequence for Fabricating an Acoustic Device

Figure 13:
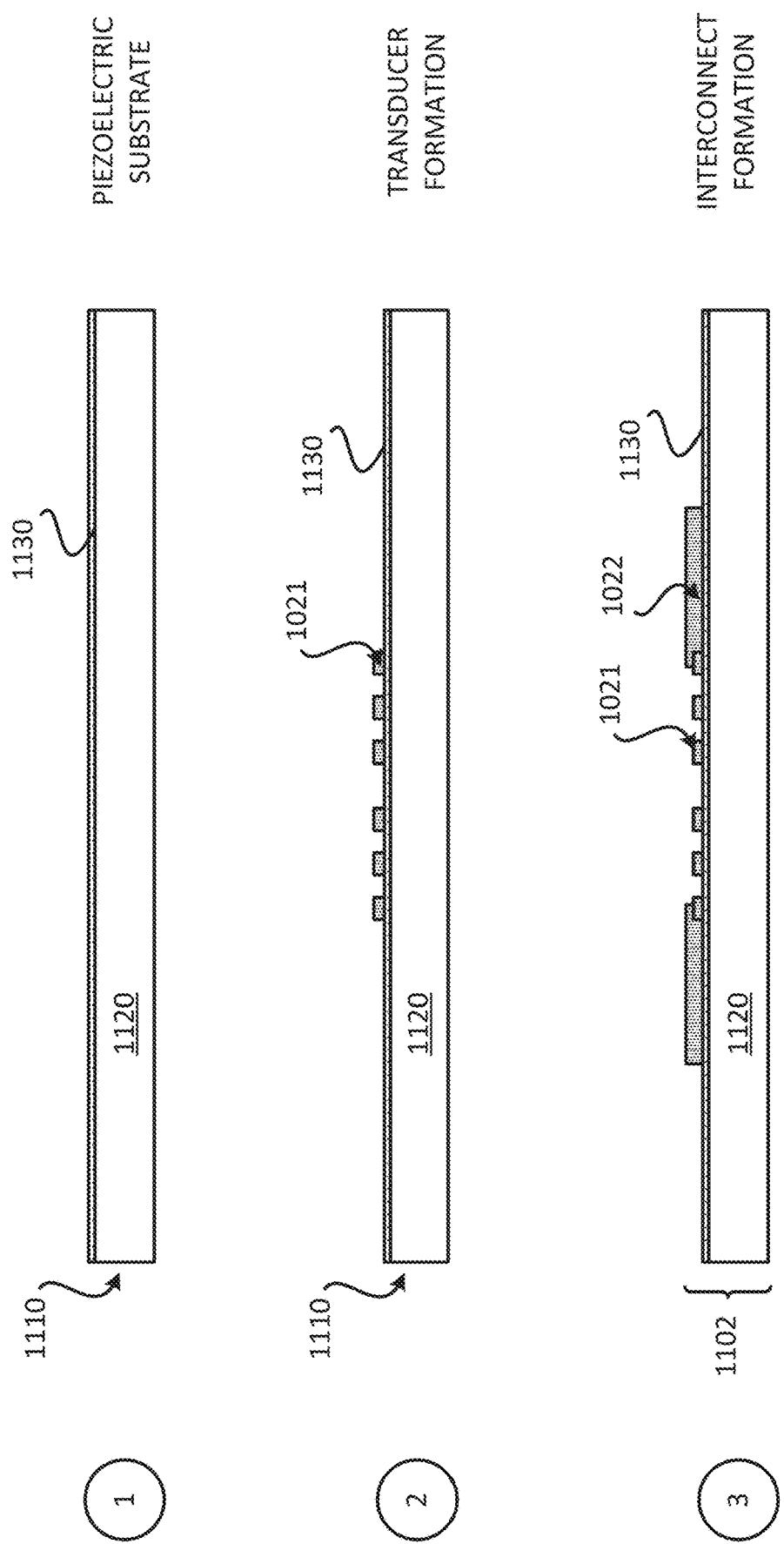
FIG. 13 illustrates an exemplary sequence for fabricating an acoustic device.

In some implementations, fabricating an acoustic device includes several processes. FIG. 13 illustrates an exemplary sequence for providing or fabricating an acoustic device. In some implementations, the sequence of FIG. 13 may be used to provide or fabricate the acoustic device 1102 of FIG. 11. However, the process of FIG. 13 may be used to fabricate any of the acoustic devices described in the disclosure.

It should be noted that the sequence of FIG. 13 may combine one or more stages in order to simplify and/or clarify the sequence for providing or fabricating an acoustic device. In some implementations, the order of the processes may be changed or modified. In some implementations, one or more of processes may be replaced or substituted without departing from the spirit of the disclosure.

Stage 1, as shown in FIG. 13, illustrates a state after a substrate 1110 is provided. The substrate 1110 may be a piezoelectric substrate. The substrate 1110 may include a substrate 1120 and a piezoelectric layer 1130 coupled to and located over a surface of the substrate 1120. In some implementations, the substrate 1120 includes silicon (Si).

Different implementations may use different material may be used for the piezoelectric material (e.g., Lithium Niobate, Lithium Tantalate).

Stage 2 illustrates a state after the acoustic element 1021 is formed over the substrate 1110. The acoustic element 1021 may be coupled to and located over the piezoelectric layer 1130. The acoustic element 1021 may be defined by forming and patterning at least one metal layer over the substrate 1110. A patterning and an evaporation (or a plating) process may be used to form the at least one metal layer, which may define the acoustic element 1021. The acoustic element 1021 may include a transducer.

Stage 3 illustrates a state after a plurality of interconnects 1022 is formed over the substrate 1110. The plurality of interconnects 1022 may be coupled to and located over the piezoelectric layer 1130. The plurality of interconnects 1022 may be coupled to the acoustic element 1021. The plurality of interconnects 1022 may be defined by forming and patterning at least one metal layer over the substrate 1110. A patterning and an evaporation (or a plating) process may be used to form the at least one metal layer, to form the plurality of interconnects 1022. Stage 3 may illustrate the acoustic device 1102 that includes the substrate 1110, the acoustic element 1021 and the plurality of interconnects 1022.

Exemplary Flow Diagram of a Method for Fabricating an Acoustic Device

Figure 14:
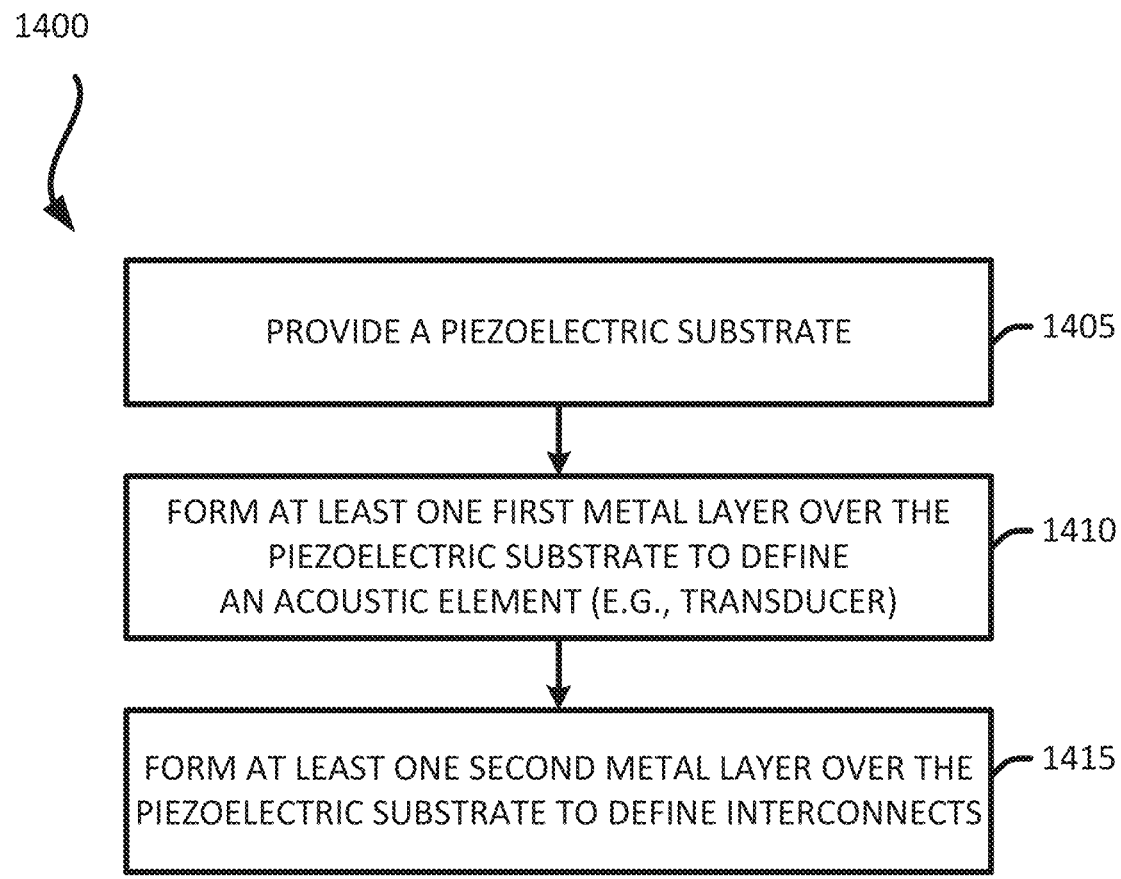
FIG. 14 illustrates an exemplary flow diagram of a method fabricating an acoustic device.

In some implementations, fabricating an acoustic device includes several processes. FIG. 14 illustrates an exemplary flow diagram of a method 1400 for providing or fabricating an acoustic device. In some implementations, the method 1400 of FIG. 14 may be used to provide or fabricate the acoustic device of FIGS. 10-11.

It should be noted that the method 1400 of FIG. 14 may combine one or more processes in order to simplify and/or clarify the method for providing or fabricating an acoustic device and a metallization portion. In some implementations, the order of the processes may be changed or modified.

The method provides (at 1405) a piezoelectric substrate (e.g., 1010, 1110). The entire substrate may be made of a piezoelectric material or only a portion of the substrate may include a piezoelectric material. For example, the substrate 1110 may include a substrate 1120 and a piezoelectric layer located over and coupled to the substrate 1120. Different implementations may use different material may be used for the piezoelectric material and/or piezoelectric layer (e.g., Lithium Niobate, Lithium Tantalate). Stage 1 of FIG. 12 and Stage 1 of FIG. 13 illustrate and describe examples of providing a piezoelectric substrate.

The method forms (at 1410) at least one first metal layer over the substrate to form and define an acoustic element. The first metal layer may form the acoustic element 1021. A patterning (masking) and an evaporation (or a plating) process may be used to form the at least one metal layer, which may define the acoustic element 1021. The acoustic element 1021 may include a transducer. Stage 2 of FIG. 12 and Stage 2 of FIG. 13 illustrates and describes an example of forming at least one first metal layer to form and define an acoustic element.

The method forms (at 1415) at least one second metal layer over the substrate to form and define a plurality of interconnects. The second metal layer may form the plurality of interconnects 1022. The plurality of interconnects 1022 may be coupled to the acoustic element 1021. A patterning (masking) and an evaporation (or a plating) process may be used to form the at least one second metal layer, to form the plurality of interconnects 1022. Stage 3 of FIG. 12 and Stage 3 of FIG. 13 illustrate and describe an example of forming at least one second metal layer to form and define a plurality of interconnects.

Exemplary Sequence for Fabricating a Package Comprising an Acoustic Device and a Polymer Cap Layer In some implementations, fabricating a package includes several processes. FIGS. 15A-15J illustrate an exemplary sequence for providing or fabricating a package. In some implementations, the sequence of FIGS. 15A-15J may be used to provide or fabricate the package 700 of FIG. 7. However, the process of FIGS. 15A-15J may be used to fabricate any of the packages (e.g., 100, 200, 300) described in the disclosure.

It should be noted that the sequence of FIGS. 15A-15J may combine one or more stages in order to simplify and/or clarify the sequence for providing or fabricating a package. In some implementations, the order of the processes may be changed or modified. In some implementations, one or more of processes may be replaced or substituted without departing from the spirit of the disclosure.

Figure 15A:
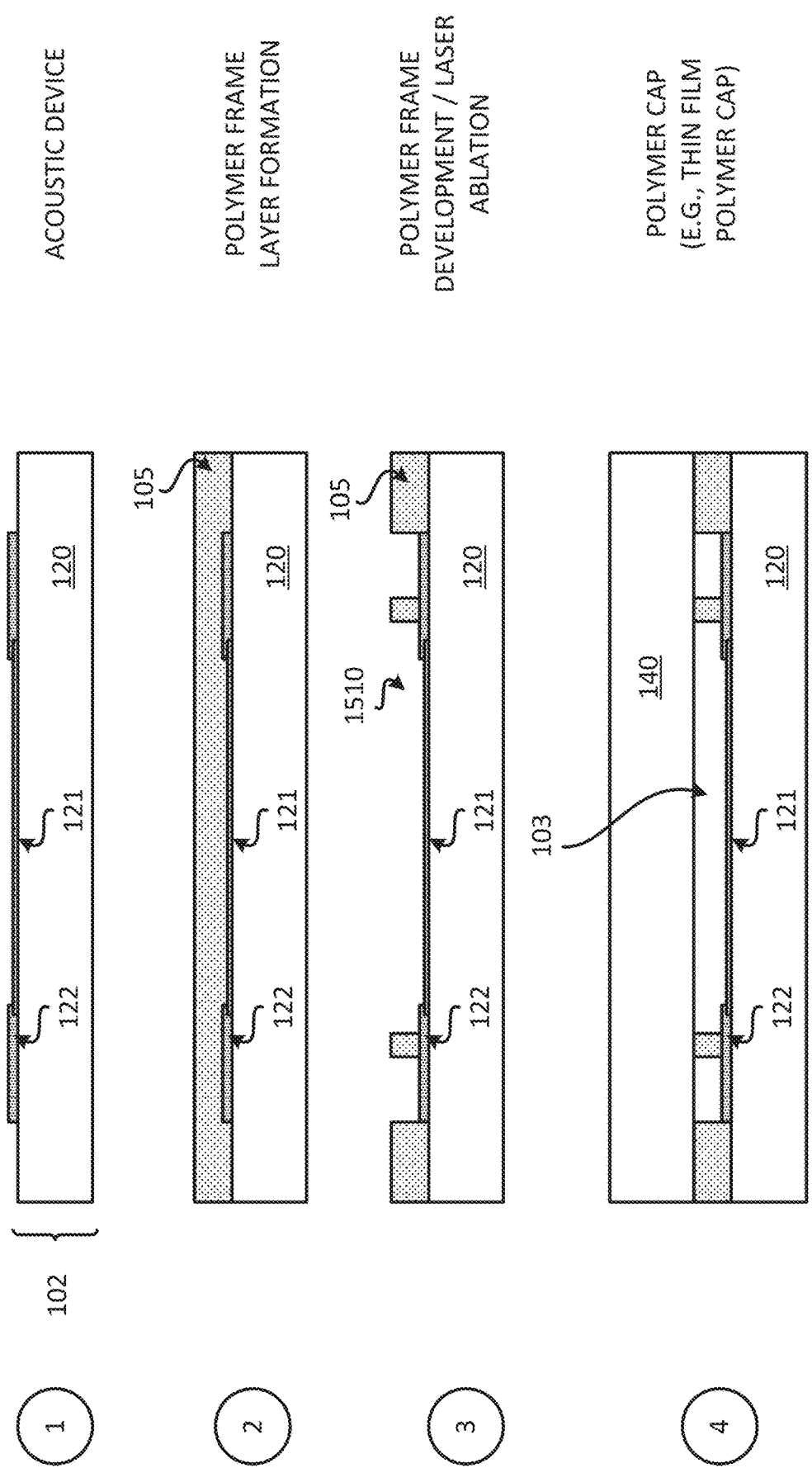
FIGS. 15A-15J illustrate an exemplary sequence for fabricating a package comprising an acoustic device and a polymer cap for the acoustic device.

Stage 1, as shown in FIG. 15A, illustrates a state after the acoustic device 102 is provided. The acoustic device 102 includes a substrate 120, an acoustic element 121 and a plurality of interconnects 122. The acoustic element 121 may include several acoustic elements.

Stage 2 illustrates a state after a polymer frame 105 is provided over the acoustic device 102. A deposition process and/or lamination process may be used to form the polymer frame 105.

Stage 3 illustrates a state after the polymer frame 105 is developed (ablation lasering is as well possible) to form openings 1510 in the polymer frame 105 that exposes the acoustic element 121 and the plurality of interconnects 122. The developing of the polymer frame 105 may form one or more compartments (e.g., 803a, 903a) for the polymer frame 105. A photolithography process (e.g., exposure and developing process) may be used to form the shape, boundaries and/or compartments of the polymer frame 105.

Stage 4 illustrates a state after a polymer layer 140 is provided over the polymer frame 105. A deposition process and/or lamination process may be used to form the polymer layer 140. The polymer layer 140 may include a polymer material that is similar or different than the polymer material of the polymer frame 105. Stage 4 also illustrates the cavity 103 that is formed between the polymer layer 140 and the acoustic device 102. The cavity 103 may include several cavities that are defined by boundaries of the compartments of the polymer frame 105.

Figure 15B:
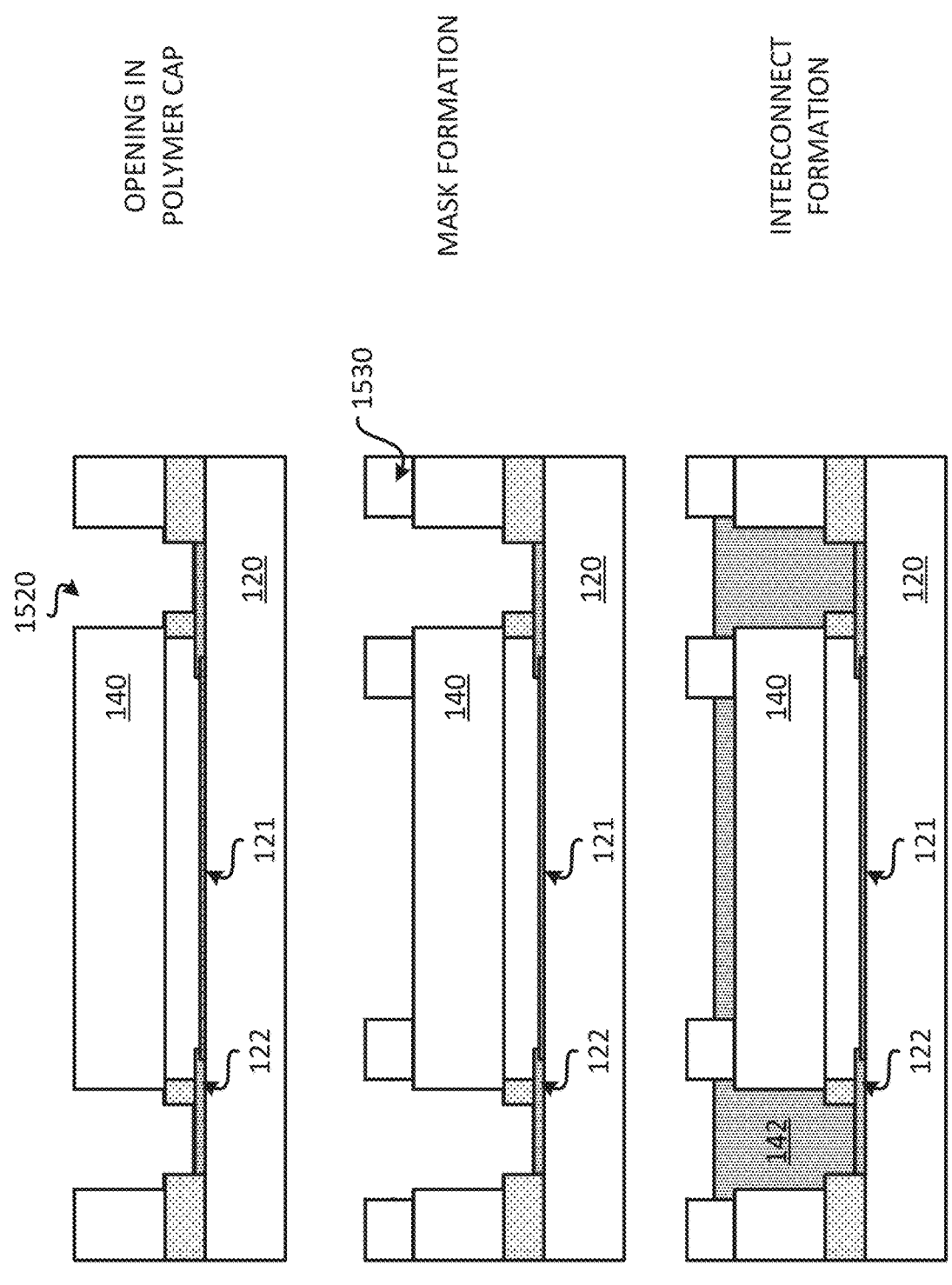

Stage 5, as shown in FIG. 15B, illustrates a state after the polymer layer 140 is developed to form openings 1520 in the polymer layer 140. A photolithography process (e.g., exposure and developing process) may be used to form the openings in the polymer layer 140.

Stage 6 illustrates a state after a mask 1530 is formed over the polymer layer 140. The mask 1530 may include openings that exposes the polymer layer 140. Forming a mask may include spin coating, photolithography and developing.

In some implementations, prior to mask formation, a seed layer may be formed over a surface of the plurality of interconnects 122, a surface of the polymer frame 105 and a surface of the polymer layer 140. A sputtering or chemical plating process (e.g., Ti/Cu sputtering or electroless plating) may be used to form seed layer.

Stage 7 illustrates a state after a plurality of interconnects 142 are formed through openings of the mask 1530. A plating process may be used to form the plurality of interconnects 142. The plurality of interconnects 142 may be coupled to the plurality of interconnects 122.

Figure 15C:
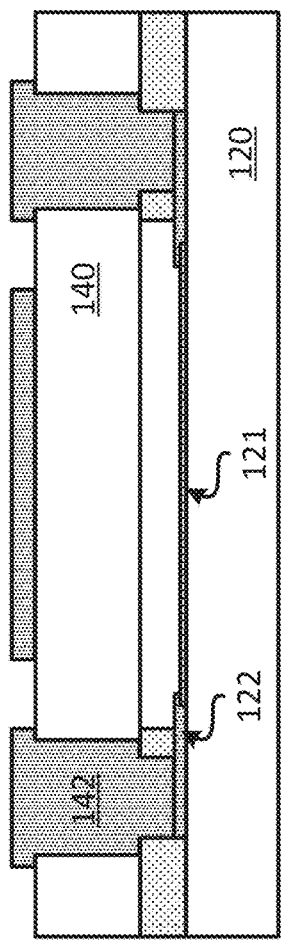
Figure 15C:
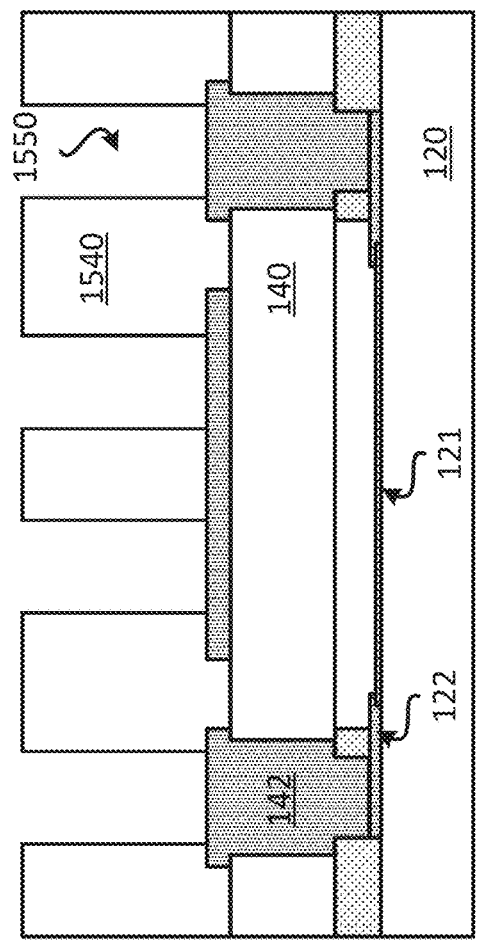

Stage 8, as shown in FIG. 15C, illustrates a state after the mask 1530 is removed. Removing the mask 1530 may include stripping a resist.

Stage 9 illustrates a state after a mask 1540 is formed over the polymer layer 140 and the plurality of interconnects 142. The mask 1540 may include openings 1550 that exposes the plurality of interconnects 142. Forming a mask may include spin coating, photolithography and developing.

Figure 15D:
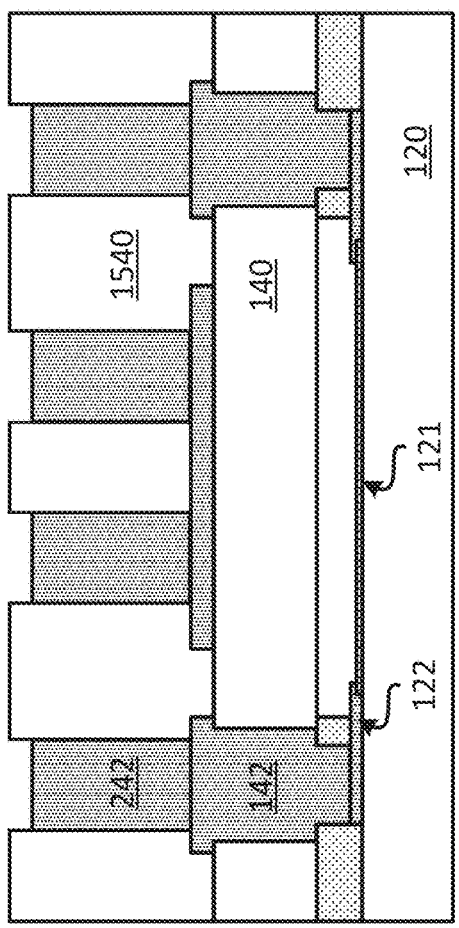
Figure 15D:
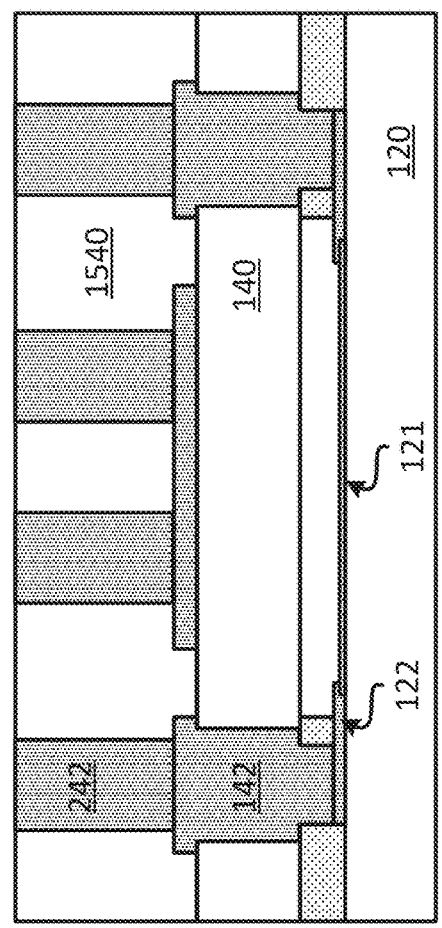

Stage 10, as shown in FIG. 15D, illustrates a state after a plurality of encapsulation interconnects 242 are formed over the plurality of interconnects 142 and through openings of the mask 1540. A plating process may be used to form the plurality of encapsulation interconnects 242. The plurality of encapsulation interconnects 242 may be coupled to the plurality of interconnects 142.

Stage 11 illustrates a state after portions of the mask 1540 and/or the plurality of encapsulation interconnects 242 are removed. For example, portions of the mask 1540 and/or portions of the plurality of encapsulation interconnects 242 may be grinded out and/or polished out. In some implementations, the plurality of encapsulation interconnects 242 may be encapsulation interconnects with high aspect ratios (e.g., 2:1 aspect ratio (e.g., height to width ratio). For example, an encapsulation interconnect may have a height of about 100 micrometers and a width of about 50 micrometers. Different implementations may have different heights, widths and/or aspect ratios.

Figure 15E:
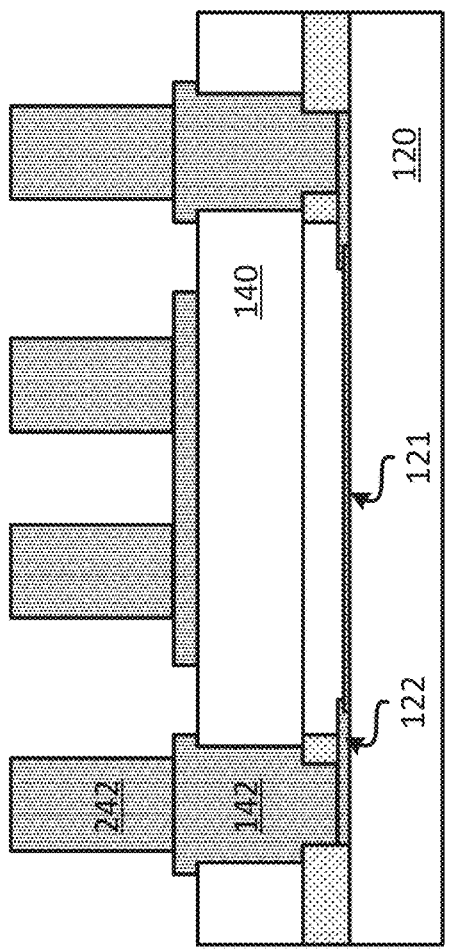
Figure 15E:
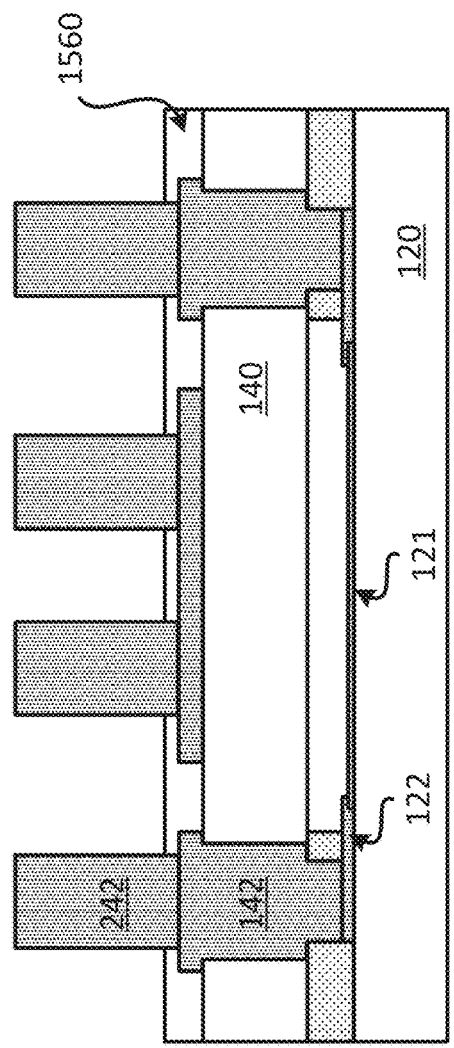

Stage 12, as shown in FIG. 15E, illustrates a state after the mask 1540 is removed. Removing the mask 1540 may include stripping a resist.

Stage 13 illustrates a state after an encapsulation layer 1560 is optionally formed. The encapsulation layer 1560 may be formed over and/or around the polymer layer 140 and the plurality of interconnects 142 and/or the plurality of encapsulation interconnects 242. The encapsulation layer 1560 may include a mold, a resin and/or an epoxy. A compression molding process, a transfer molding process, or a liquid molding process may be used to form the encapsulation layer 1560. The formation of the encapsulation layer 1560 may be skipped in some implementations.

Figure 15F:
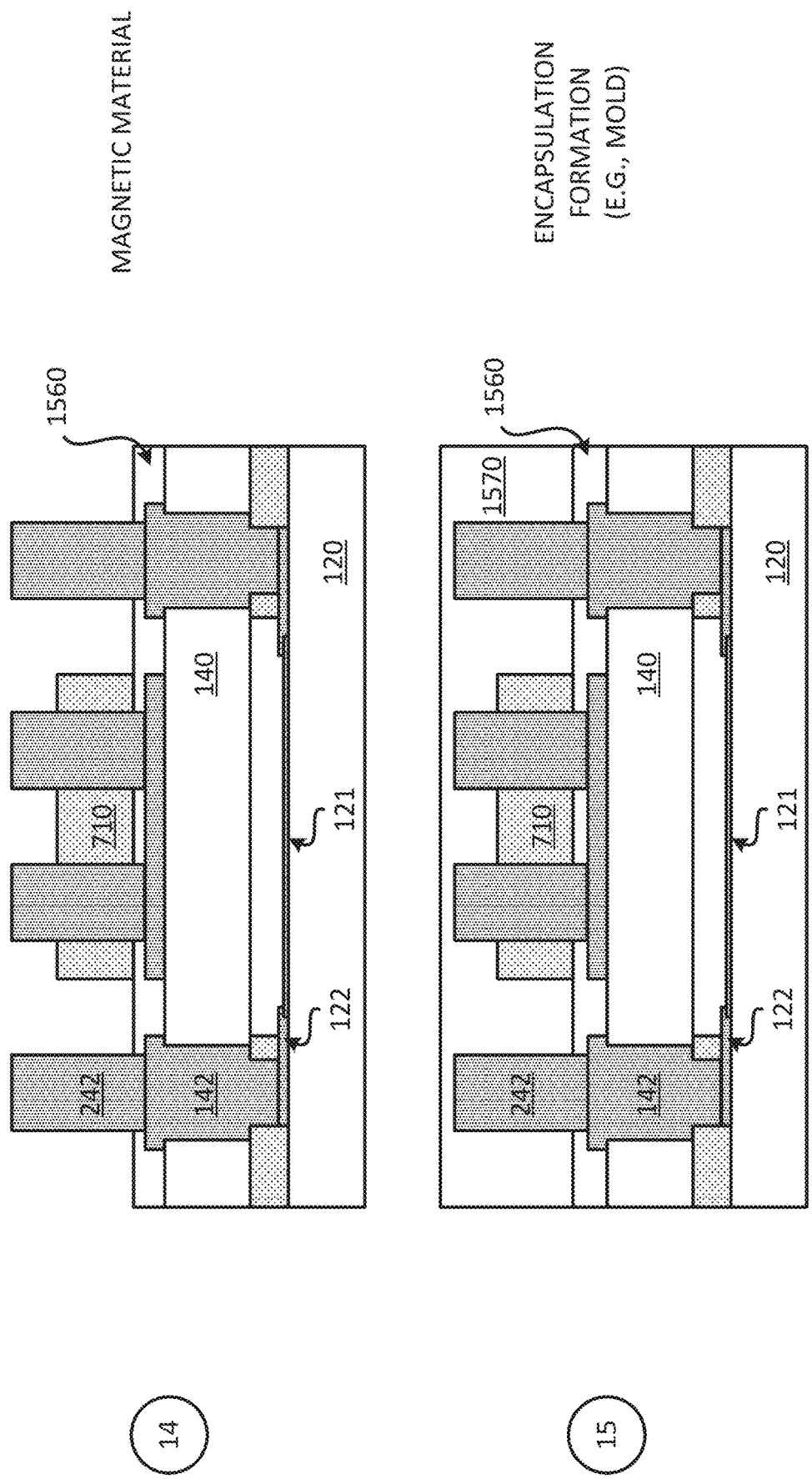

Stage 14, as shown in FIG. 15F, illustrates a state after a magnetic inlay 710 is optionally provided over the polymer layer 140 and/or the encapsulation layer 1560. The magnetic inlay 710 may include a solid ferromagnetic inlay. The magnetic inlay 710 may be placed over the encapsulation layer 1560. In some implementations, the magnetic inlay 710 may be placed over the polymer layer 140.

Stage 15 illustrates a state after an encapsulation layer 1570 is formed over the encapsulation layer 1560, the magnetic inlay 710 and the plurality of encapsulation interconnects 242. The encapsulation layer 1570 may include a mold, a resin and/or an epoxy. A compression molding process, a transfer molding process, or a liquid molding process may be used to form the encapsulation layer 1570. The encapsulation layer 1570 may be similar to the encapsulation layer 1560. In some implementations, the encapsulation layer 1560 and the magnetic inlay 710 may be skipped. In such instances, the encapsulation layer 1570 may be formed over the polymer layer 140, the plurality of interconnects 142 and the plurality of encapsulation interconnects 242. In some implementations, the encapsulation layer 1570 may include a material with magnetic properties. For example, the encapsulation layer 1570 may include a ferrite ceramic as filler. The encapsulation layer 1560 and/or the encapsulation layer 1570 may be represented as the encapsulation layer 240.

Figure 15G:
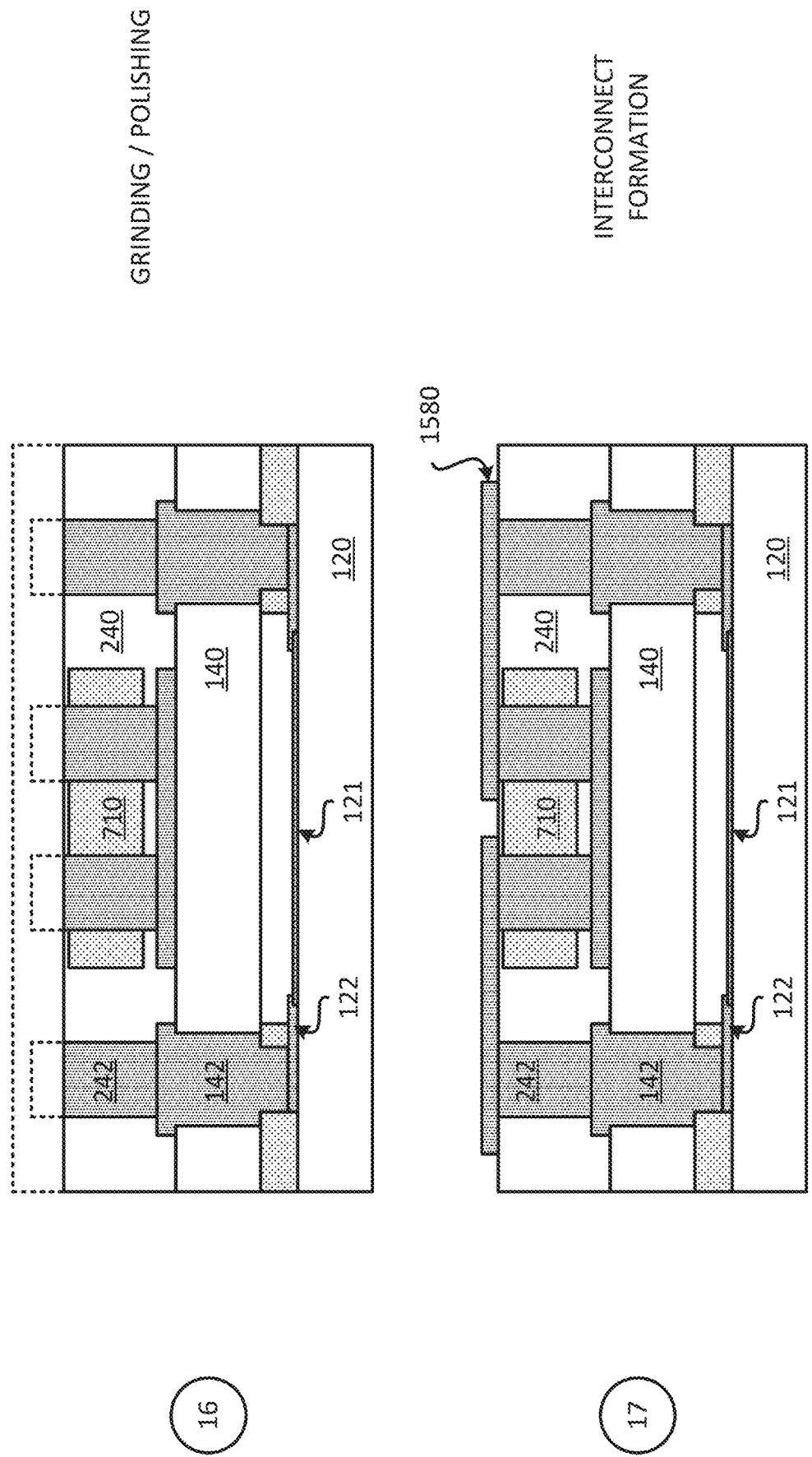

Stage 16, as shown in FIG. 15G, illustrates a state after portions of the encapsulation layer 240 and/or the plurality of encapsulation interconnects 242 are removed. For example, portions of the encapsulation layer 240 and/or portions of the plurality of encapsulation interconnects 242 may be grinded out and/or polished out. In some implementations, the plurality of encapsulation interconnects 242 may be encapsulation interconnects with high aspect ratios (e.g., 2:1 aspect ratio (e.g., height to width ratio). For example, an encapsulation interconnect may have a height of about 100 micrometers and a width of about 50 micrometers. Different implementations may have different heights, widths and/or aspect ratios.

Stage 17 illustrates a state after a plurality of interconnects 1580 are formed over the polymer layer 140 and the plurality of encapsulation interconnects 242. A plating process may be used to form the plurality of interconnects 1580. In some implementations, the plurality of interconnects 1580 may be considered part of the plurality of encapsulation interconnects 242. In some implementations, forming the plurality of interconnects 1580 may include forming a seed layer may and forming a mask. A mask may be formed over the seed layer and the plurality of interconnects 1580 may be formed over the seed layer through openings in the mask. The mask and portions of the seed layer may be removed. Some encapsulation interconnects from the plurality of encapsulation interconnects 242 and some interconnects from the plurality of interconnects 142 may form an inductor 210.

Figure 15H:
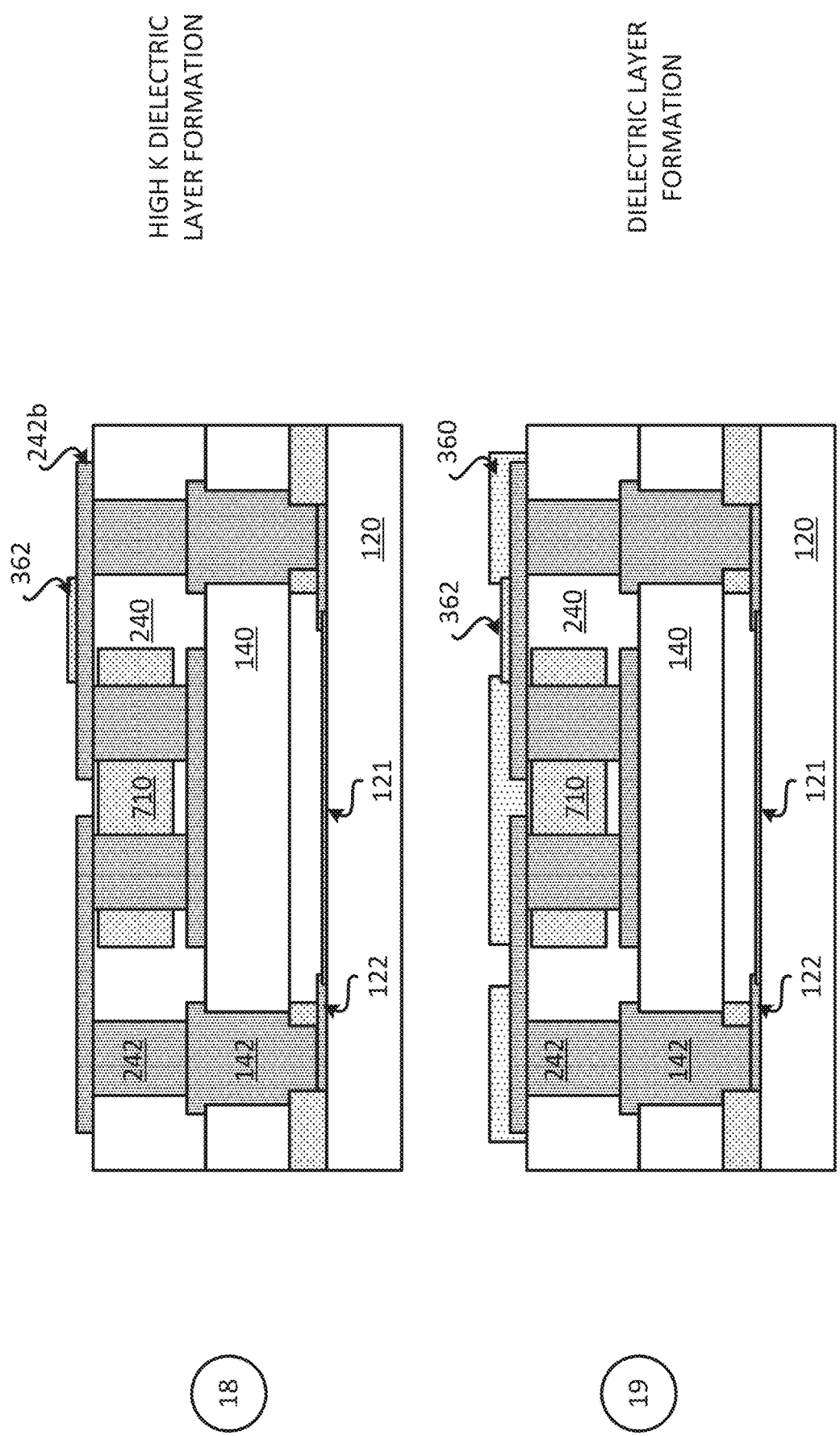

Stage 18, as shown in FIG. 15H, illustrates a state after a high K dielectric layer 362 is formed. The high K dielectric layer 362 may be formed over the encapsulation interconnect 242b. A deposition process and/or a lamination process may be used to form the high K dielectric layer 362.

Stage 19 illustrates a state after a dielectric layer 360 is formed over the encapsulation layer 240. A deposition process and/or a lamination process may be used to form the dielectric layer 360.

Figure 15I:
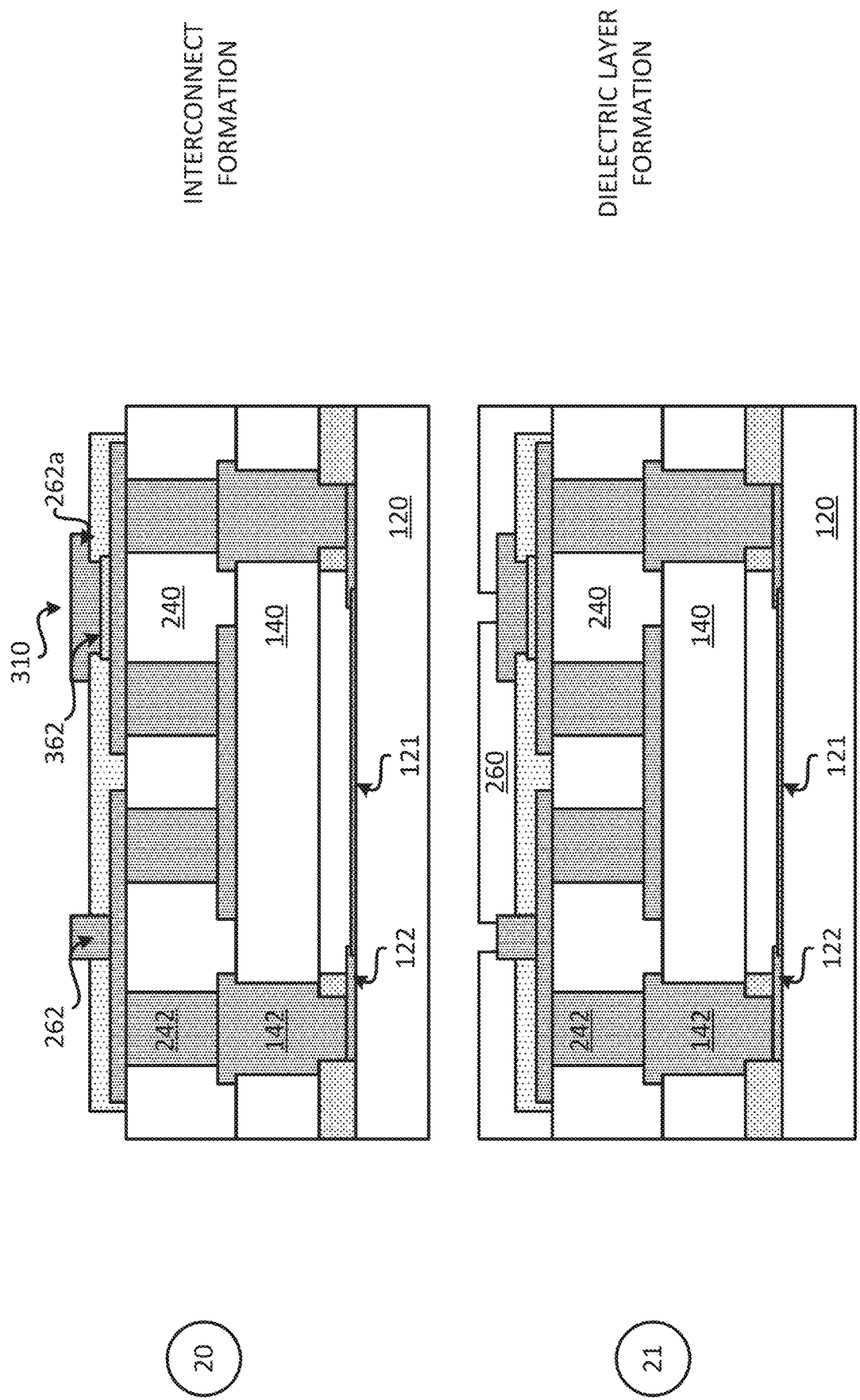

Stage 20, as shown in FIG. 15I, illustrates a state after a plurality of interconnects 262 are formed. The plurality of interconnects 262 may include an interconnect 262a that is coupled to and formed over the high K dielectric layer 362. The interconnect 262a, the high K dielectric layer 362 and the encapsulation interconnect 242b may form a capacitor 310, as described in FIG. 7. A plating process may be used to form the plurality of interconnects 262.

Stage 21 illustrates a state after a dielectric layer 260 is formed over the polymer layer 140, the dielectric layer 360 and the plurality of interconnects 262. A deposition process and/or a lamination process may be used to form the dielectric layer 260. The dielectric layer 260 may be similar or the same as the dielectric layer 360. In some implementations, the formation of the dielectric layer 260 may be skipped.

Figure 15J:
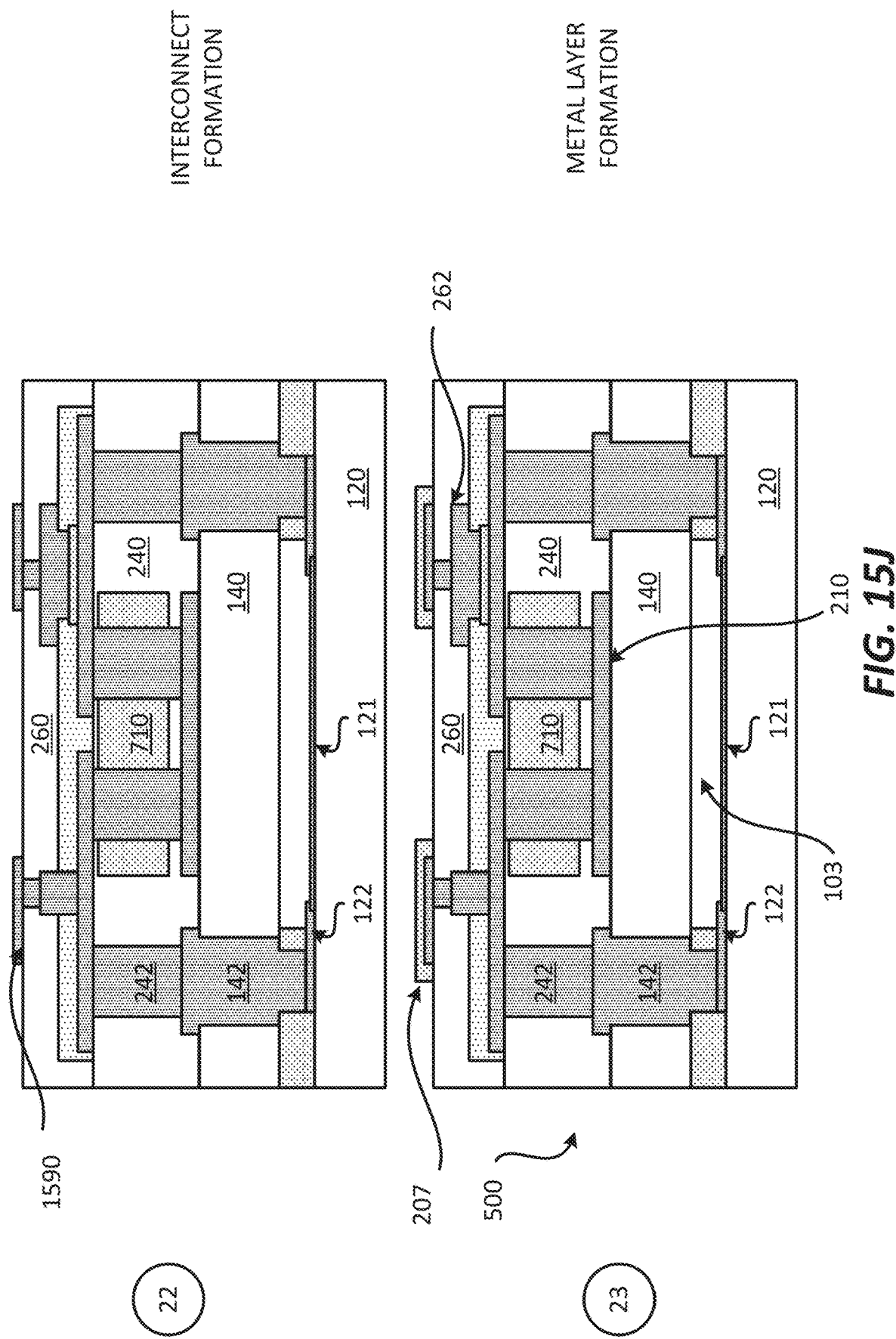

Stage 22, as shown in FIG. 15J, illustrates a state after a plurality of interconnects 1590 are formed. The plurality of interconnects 1590 may be coupled to the plurality of interconnects 262. The plurality of interconnects 1590 may be considered part of the plurality of interconnects 262. A plating process may be used to form the plurality of interconnects 1590. In some implementations, the formations of the plurality of interconnects 1590 may be skipped.

Stage 23 illustrates a state after a plurality of interconnects 207 is formed over the plurality of encapsulation interconnects 242. A plating process may be used to form the plurality of interconnects 207. The plurality of interconnects 207 may include a land grid array (LGA). The plurality of interconnects 207 may include one or more metal layers. The plurality of interconnects 207 may include electro plated finishing or electroless plated finishing. In some implementations, the formations of the plurality of interconnects 207 may be skipped. Stage 23 illustrates the package 700 that includes the acoustic device 102, the polymer frame 105, the polymer cap layer 104, the metallization portion 204 and the metallization portion 206.

Once the package (e.g., 100, 200, 300, 700) is fabricated, the package may be coupled to a board 106 through a plurality of interconnects 207. For example, the package (e.g., 100, 200, 300, 700) may be coupled to the plurality of board interconnects 162 through the plurality of interconnects 207.

Figure 16A:
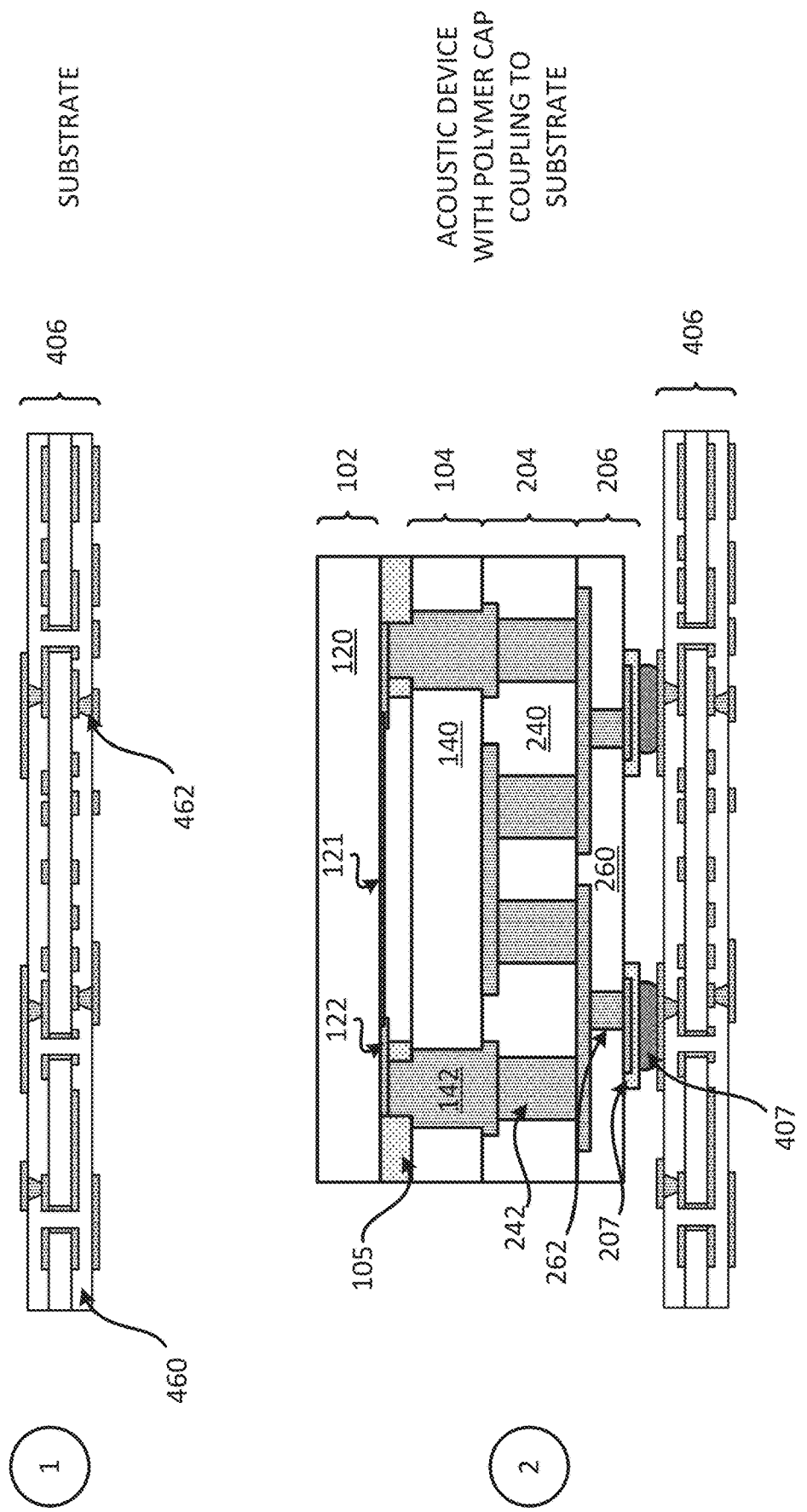
FIGS. 16A-16B illustrate an exemplary sequence for fabricating a package comprising an acoustic device and a polymer cap for the acoustic device.
Figure 16B:
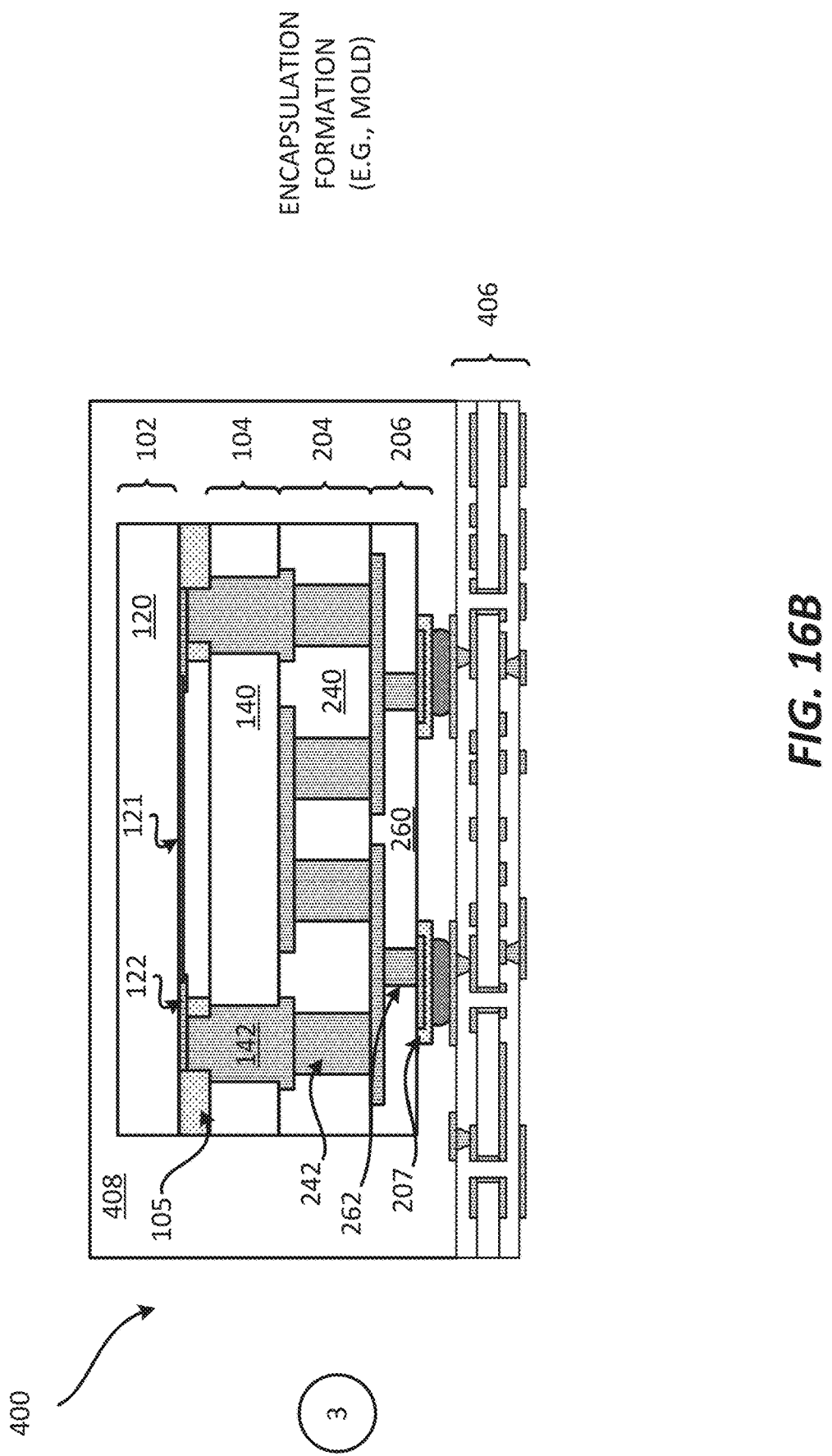

Exemplary Sequence for Fabricating a Package Comprising an Acoustic Device and a Polymer Cap Layer In some implementations, fabricating a package includes several processes. FIGS. 16A-16B illustrate an exemplary sequence for providing or fabricating a package that includes an acoustic device and a polymer cap layer. In some implementations, the sequence of FIGS. 16A-16B may be used to provide or fabricate the package 400 of FIG. 4. However, the process of FIGS. 16A-16B may be used to fabricate any of the packages described in the disclosure.

It should be noted that the sequence of FIG. 16A-16B may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 16A, illustrates a state after a substrate 406 is provided. The substrate 406 includes at least one dielectric layer 460 and a plurality of substrate interconnects 462. The at least one dielectric layer 460 may include a core layer. Different implementations may use different substrates with different numbers of metal layers. A substrate may include a laminated substrate, a coreless substrate, a cored substrate, and/or an embedded trace substrate (ETS). The substrate 406 may be a package substrate.

Stage 2 illustrates a state after the package 200 is coupled to a first surface (e.g., top surface) of the substrate 406 through a plurality of solder interconnects 407. A solder reflow process may be used to couple the package 200 to the substrate 406.

Stage 3 illustrates a state after an encapsulation layer 408 is provided (e.g., formed) over the substrate 406. The encapsulation layer 408 may encapsulate the package 200. The encapsulation layer 408 may include a mold, a resin and/or an epoxy. A compression molding process, a transfer molding process, or a liquid molding process may be used to form the encapsulation layer 408. The encapsulation layer 108 may be a means for encapsulation.

Figure 17:
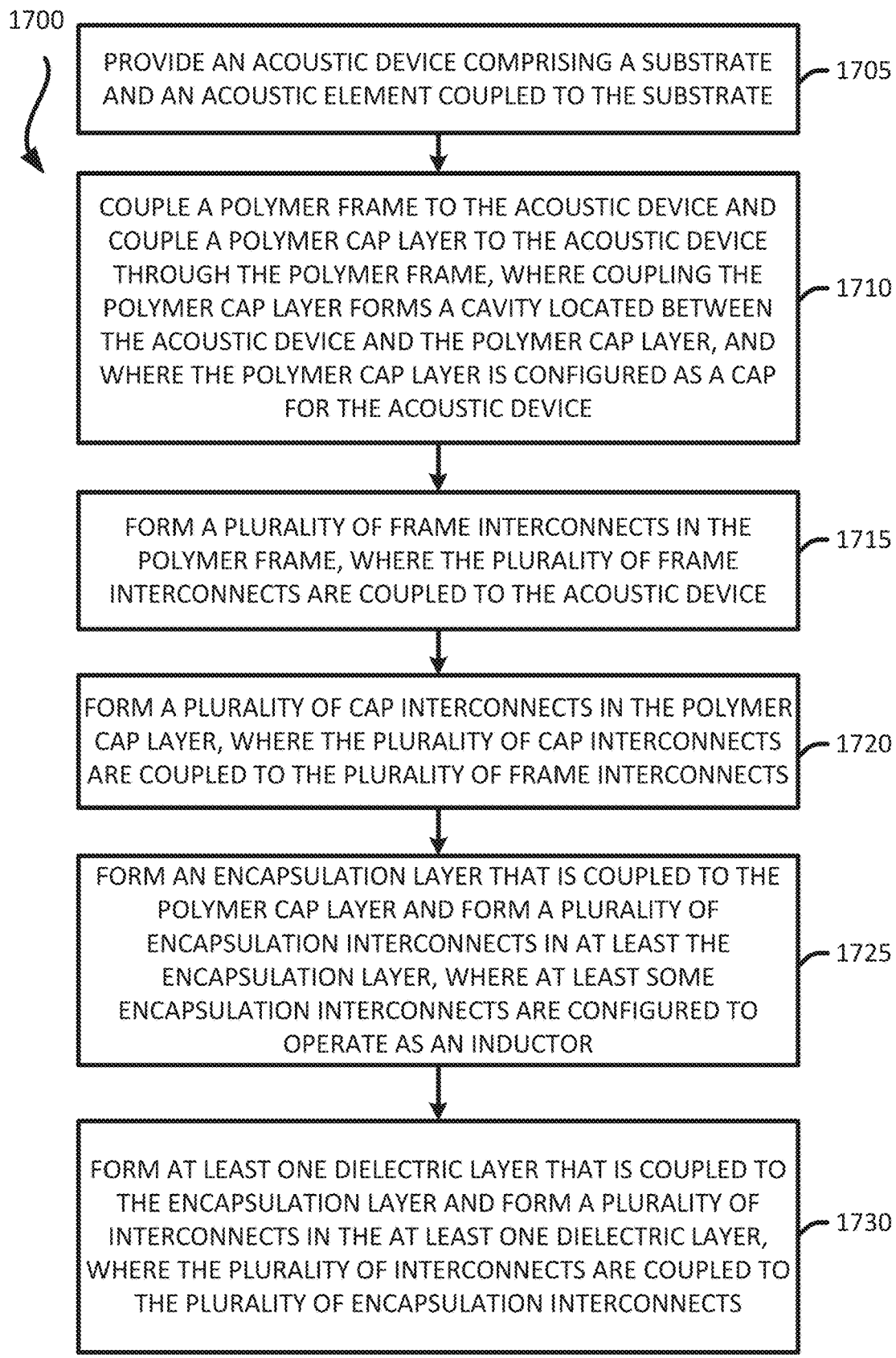
FIG. 17 illustrates an exemplary flow diagram of a method fabricating a package that includes an acoustic device and a polymer cap for the acoustic device.

Exemplary Flow Diagram of a Method for Fabricating a Package Comprising an Acoustic Device and a Polymer Cap In some implementations, fabricating a package that includes an acoustic device and a polymer cap includes several processes. FIG. 17 illustrates an exemplary flow diagram of a method 1700 for providing or fabricating a package. In some implementations, the method 1700 of FIG. 17 may be used to provide or fabricate the packages of at least FIGS. 1-9.

It should be noted that the method 1700 of FIG. 17 may combine one or more processes in order to simplify and/or clarify the method for providing or fabricating a package. In some implementations, the order of the processes may be changed or modified.

The method provides (at 1705) an acoustic device (e.g., 102) that includes a substrate and an acoustic element coupled to the substrate. Stage 1 of FIG. 15A illustrates an example of providing an acoustic device. FIGS. 12 and 13 illustrate examples of how an acoustic device may be fabricated and provided.

The method couples (at 1710) a polymer frame (e.g., 105) to the acoustic device and couples (at 1710) a polymer cap layer to the acoustic device through the polymer frame. The coupling of the polymer cap layer forms a cavity located between the acoustic device and the polymer cap layer. The polymer cap layer is configured as a cap for the acoustic device. Stages 2-5 of FIGS. 15A-15B illustrate examples of providing a polymer frame and a polymer cap layer.

The method forms (at 1715) a plurality of frame interconnects in the polymer frame, where the plurality of frame interconnects are coupled to the acoustic device. Stages 6-8 of FIGS. 15B-15C illustrate examples of forming a plurality of interconnects in the polymer frame.

The method forms (at 1720) a plurality of cap interconnects in the polymer cap layer, where the plurality of cap interconnects are coupled to the plurality of frame interconnects. Stages 6-8 of FIGS. 15B-15C illustrate examples of forming a plurality of interconnects in the polymer cap layer. The plurality of cap interconnects may be formed during the same process as forming the plurality of frame interconnects.

The method forms (at 1725) an encapsulation layer (e.g., 240) that is coupled to the polymer cap layer, and forms (at 1725) a plurality of encapsulation interconnects (e.g., 242) in at least in the encapsulation layer. The plurality of encapsulation interconnects are coupled to the plurality of cap interconnects. At least some of the plurality of encapsulation interconnects are configured to operate as an inductor. In some implementations, a magnetic material may be provided in the encapsulation layer. Stages 9-17 of FIGS. 15B-150 illustrate examples of forming an encapsulation layer and encapsulation interconnects.

The method forms (at 1730) at least one dielectric layer (e.g., 260) that is coupled to the encapsulation layer, and forms (at 1730) a plurality of interconnects (e.g., 262) in at least in the at least one dielectric layer, wherein the plurality of interconnects are coupled to the plurality of encapsulation interconnects. Forming the dielectric layer and the plurality of interconnects may also include forming a capacitor that includes a high K dielectric layer. Stages 18-23 of FIGS. 15H-15J illustrate examples of forming a at least one dielectric layer and a plurality of interconnects.

Exemplary Electronic Devices

Figure 18:
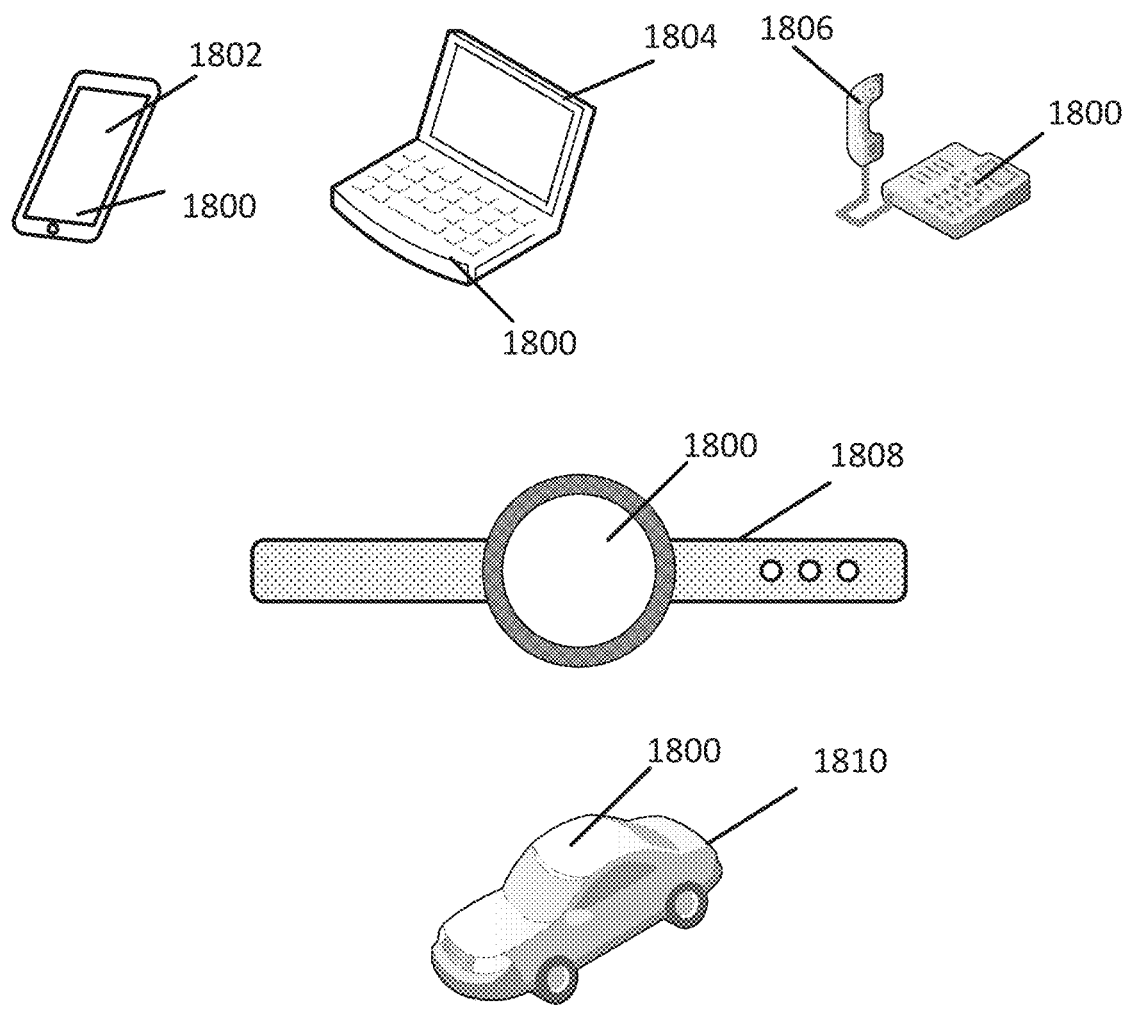
FIG. 18 illustrates various electronic devices that may integrate a die, an integrated device, an integrated passive device (IPD), a passive component, a package, and/or a device package described herein.

FIG. 18 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1802, a laptop computer device 1804, a fixed location terminal device 1806, a wearable device 1808, or automotive vehicle 1810 may include a device 1800 as described herein. The device 1800 may be, for example, any of the devices and/or integrated circuit (IC) packages described herein. The devices 1802, 1804, 1806 and 1808 and the vehicle 1810 illustrated in FIG. 18 are merely exemplary. Other electronic devices may also feature the device 1800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-14, 15A-15J, 16A-16B, and/or 17-18 may be rearranged and/or combined into a single component, process, feature or function or embodied in several components, processes, or functions. Additional elements, components, processes, and/or functions may also be added without departing from the disclosure. It should also be noted FIGS. 1-14, 15A-15J, 16A-16B, and/or 17-18 and its corresponding description in the present disclosure is not limited to dies and/or ICs. In some implementations. FIGS. 1-14, 15A-15J, 16A-16B, and/or 17-18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or an electro plating process or electroless plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising an acoustic device, a polymer frame coupled to the acoustic device, a plurality of frame interconnects located in the polymer frame, wherein the plurality of frame interconnects are coupled to the acoustic device, a polymer cap layer coupled to the acoustic device through the polymer frame, wherein the polymer cap layer is configured as a cap for the acoustic device, a plurality of cap interconnects located in the polymer cap layer, wherein the plurality of cap interconnects are coupled to the plurality of frame interconnects, and a cavity located between the acoustic device and the polymer cap layer. The acoustic device includes a substrate and an acoustic element coupled to the substrate.

Aspect 2: The package of aspect 1, wherein the plurality of cap interconnects are coupled to the acoustic device through the plurality of frame interconnects.

Aspect 3: The package of aspects 1 through 2, further comprising an encapsulation layer coupled to the polymer cap layer; and a plurality of encapsulation interconnects located at least in the encapsulation layer, wherein the plurality of encapsulation interconnects are coupled to the plurality of cap interconnects, and wherein at least some of the plurality of encapsulation interconnects are configured to operate as an inductor.

Aspect 4: The package of aspect 3, wherein the encapsulation layer includes a magnetic material that has permeability of 1 or greater.

Aspect 5: The package of aspect 4, wherein the magnetic material includes a ferrite ceramic as a filler for the encapsulation layer.

Aspect 6: The package of aspect 3, further comprising a magnetic inlay located in the encapsulation layer.

Aspect 7: The package of aspect 6, wherein the magnetic inlay includes a ferromagnetic inlay.

Aspect 8: The package of aspects 3 through 7, further comprising at least one dielectric layer coupled to the encapsulation layer; and a plurality of interconnects located at least in the at least one dielectric layer, wherein the plurality of interconnects are coupled to the plurality of encapsulation interconnects.

Aspect 9: The package of aspects 3 through 7, further comprising a high K dielectric layer coupled to an encapsulation interconnect from the plurality of encapsulation interconnects; at least one dielectric layer coupled to the encapsulation layer; and a plurality of interconnects located at least in the at least one dielectric layer, wherein the plurality of interconnects are coupled to the plurality of encapsulation interconnects, wherein an interconnect from the plurality of interconnects is coupled to the high K dielectric layer, and wherein the encapsulation interconnect, the high K dielectric layer and the interconnect are configured to operate as a capacitor.

Aspect 10: The package of aspects 3 through 9, wherein the plurality of encapsulation interconnects include at least one encapsulation interconnect that includes an aspect ratio of about 2:1 or higher.

Aspect 11: The package of aspects 1 through 10, further comprising a package substrate coupled to the plurality of cap interconnects through a plurality of solder interconnects such that a back side of the acoustic device faces away from the package substrate; and an encapsulation layer coupled to the package substrate, the polymer cap layer, the polymer frame and the acoustic device.

Aspect 12: The package of aspect 11, wherein the substrate includes a plurality of interconnects, and wherein at least some interconnects from the plurality of interconnects, at least some solder interconnects from the plurality of solder interconnects, and at least some cap interconnects from the plurality of cap interconnects are configured to operate as an inductor.

Aspect 13: The package of aspects 1 through 2, further comprising an encapsulation layer coupled to the polymer cap layer; a plurality of encapsulation interconnects located at least in the encapsulation layer, wherein the plurality of encapsulation interconnects are coupled to the plurality of cap interconnects; a package substrate coupled to the plurality of encapsulation interconnects through a plurality of solder interconnects such that a back side of the acoustic device faces away from the package substrate; and a second encapsulation layer coupled to the package substrate, the encapsulation layer, the polymer cap layer, the polymer frame and the acoustic device.

Aspect 14: The package of aspects 1 through 2, further comprising an encapsulation layer coupled to the polymer cap layer; a plurality of encapsulation interconnects located at least in the encapsulation layer, wherein the plurality of encapsulation interconnects are coupled to the plurality of cap interconnects; at least one dielectric layer coupled to the encapsulation layer; a plurality of interconnects located at least in the at least one dielectric layer, wherein the plurality of interconnects are coupled to the plurality of encapsulation interconnects; a package substrate coupled to the plurality of interconnects through a plurality of solder interconnects such that a back side of the acoustic device faces away from the package substrate; and a second encapsulation layer coupled to the package substrate, the at least one dielectric layer, the encapsulation layer, the polymer cap layer, the polymer frame and the acoustic device.

Aspect 15: The package of aspects 1 through 14, wherein the polymer frame includes a different material than the polymer cap layer.

Aspect 16: The package of aspects 1 through 15, wherein a minimum height of the cavity is about 4 micrometers.

Aspect 17: The package of aspects 1 through 16, wherein the acoustic device is configured to operate as a surface acoustic wave (SAW) filter or a bulk acoustic wave (BAW) filter.

Aspect 18: A device comprising an acoustic device, a polymer frame coupled to the acoustic device; a plurality of frame interconnects located in the polymer frame, wherein the plurality of frame interconnects are coupled to the acoustic device; a polymer cap layer coupled to the acoustic device through the polymer frame, wherein the polymer cap layer is configured as a cap for the acoustic device; a plurality of cap interconnects located in the polymer cap layer, wherein the plurality of cap interconnects are coupled to the plurality of frame interconnects; and a cavity located between the acoustic device and the polymer cap layer. The acoustic device includes a substrate and an acoustic element coupled to the substrate.

Aspect 19: The device of aspect 18, further comprising an encapsulation layer coupled to the polymer cap layer; and a plurality of encapsulation interconnects located at least in the encapsulation layer, wherein the plurality of encapsulation interconnects are coupled to the plurality of cap interconnects, and wherein at least some of the plurality of encapsulation interconnects are configured to operate as an inductor.

Aspect 20: The device of aspect 19, wherein the encapsulation layer includes a magnetic material that has permeability of 1 or greater.

Aspect 21: The device of aspects 19 through 20, further comprising a magnetic inlay located in the encapsulation layer.

Aspect 22: The device of aspects 19 through 21, further comprising at least one dielectric layer coupled to the encapsulation layer; and a plurality of interconnects located at least in the at least one dielectric layer, wherein the plurality of interconnects are coupled to the plurality of encapsulation interconnects.

Aspect 23: The device of aspects 19 through 21, further comprising a high K dielectric layer coupled to an encapsulation interconnect from the plurality of encapsulation interconnects; at least one dielectric layer coupled to the encapsulation layer; and a plurality of interconnects located at least in the at least one dielectric layer, wherein the plurality of interconnects are coupled to the plurality of encapsulation interconnects, wherein an interconnect from the plurality of interconnects is coupled to the high K dielectric layer, and wherein the encapsulation interconnect, the high K dielectric layer and the interconnect are configured to operate as a capacitor.

Aspect 24: The device of aspects 18 through 23, wherein the acoustic device, the polymer frame and the polymer cap layer are part of a package.

Aspect 25: The device of aspects 18 through 24, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 26: A method for fabricating a package. The method provides an acoustic device comprising a substrate; and an acoustic element coupled to the substrate. The method couples a polymer frame to the acoustic device. The method couples a polymer cap layer to the acoustic device through the polymer frame, where coupling the polymer cap layer forms a cavity located between the acoustic device and the polymer cap layer, and where the polymer cap layer is configured as a cap for the acoustic device. The method forms a plurality of frame interconnects in the polymer frame, wherein the plurality of frame interconnects are coupled to the acoustic device. The method forms a plurality of cap interconnects in the polymer cap layer, wherein the plurality of cap interconnects are coupled to the plurality of frame interconnects.

Aspect 27: The method of aspect 26, further comprising forming an encapsulation layer that is coupled to the polymer cap layer; and forming a plurality of encapsulation interconnects in at least in the encapsulation layer, wherein the plurality of encapsulation interconnects are coupled to the plurality of cap interconnects, and wherein at least some of the plurality of encapsulation interconnects are configured to operate as an inductor.

Aspect 28: The method of aspect 27, further providing a magnetic inlay located in the encapsulation layer.

Aspect 29: The method of aspects 27 through 28, further comprising forming at least one dielectric layer that is coupled to the encapsulation layer; and forming a plurality of interconnects in at least in the at least one dielectric layer, wherein the plurality of interconnects are coupled to the plurality of encapsulation interconnects.

Aspect 30: The method of aspects 27 through 28, further comprising forming a high K dielectric layer that is coupled to an encapsulation interconnect from the plurality of encapsulation interconnects; forming at least one dielectric layer that is coupled to the encapsulation layer; and forming a plurality of interconnects in at least in the at least one dielectric layer, wherein the plurality of interconnects are coupled to the plurality of encapsulation interconnects, wherein an interconnect from the plurality of interconnects is coupled to the high K dielectric layer, and wherein the encapsulation interconnect, the high K dielectric layer and the interconnect are configured to operate as a capacitor.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the aspects. As such, the present teachings can be readily applied to other types of apparatuses and many alternatives, modifications, and variations will be apparent to those skilled in the art.

The invention claimed is:

1. A package comprising:
   an acoustic device comprising:
      a substrate; and
      an acoustic element coupled to the substrate;
   a polymer frame coupled to the acoustic device;
   a plurality of frame interconnects located in the polymer frame, wherein the plurality of frame interconnects are coupled to the acoustic device;
   a polymer cap layer coupled to the acoustic device through the polymer frame, wherein the polymer cap layer is configured as a cap for the acoustic device;
   a plurality of cap interconnects located in the polymer cap layer, wherein the plurality of cap interconnects are coupled to the plurality of frame interconnects; and
   a cavity located between the acoustic device and the polymer cap layer;
   an encapsulation layer coupled to the polymer cap layer, wherein the encapsulation layer is different from the polymer cap layer, and
      wherein at least a portion of the polymer cap layer is located between the encapsulation layer and the polymer frame;
   a plurality of encapsulation interconnects located at least in the encapsulation layer, where at least one encapsulation interconnect of the plurality of encapsulation interconnects is coupled to at least one of the cap interconnects of the plurality of cap interconnects.

2. The package of claim 1, wherein the plurality of cap interconnects are coupled to the acoustic device through the plurality of frame interconnects.

3. The package of claim 1,
   wherein at least some encapsulation interconnects of the plurality of encapsulation interconnects are configured to operate as an inductor.

4. The package of claim 3, wherein the encapsulation layer includes a magnetic material that has permeability of 1 or greater.

5. The package of claim 4, wherein the magnetic material includes a ferrite ceramic as a filler for the encapsulation layer.

6. The package of claim 3, further comprising a magnetic inlay located in the encapsulation layer.

7. The package of claim 6, wherein the magnetic inlay includes a ferromagnetic inlay.

8. The package of claim 3, further comprising:
   at least one dielectric layer coupled to the encapsulation layer; and
   a plurality of interconnects located at least in the at least one dielectric layer, wherein the plurality of interconnects are coupled to the plurality of encapsulation interconnects.

9. The package of claim 3, further comprising:
a high K dielectric layer coupled to an encapsulation interconnect from the plurality of encapsulation interconnects;
at least one dielectric layer coupled to the encapsulation layer; and
a plurality of interconnects located at least in the at least one dielectric layer,
wherein the plurality of interconnects are coupled to the plurality of encapsulation interconnects,
wherein an interconnect from the plurality of interconnects is coupled to the high K dielectric layer, and
wherein the encapsulation interconnect, the high K dielectric layer and the interconnect are configured to operate as a capacitor.

10. The package of claim 3, wherein the plurality of encapsulation interconnects include at least one encapsulation interconnect that includes an aspect ratio of about 2:1 or higher.

11. The package of claim 1, further comprising:
a package substrate coupled to the plurality of cap interconnects through a plurality of solder interconnects such that a back side of the acoustic device faces away from the package substrate; and
a second encapsulation layer coupled to the package substrate, the polymer cap layer, the polymer frame and the acoustic device.

12. The package of claim 11,
wherein the package substrate includes a plurality of interconnects, and
wherein at least some interconnects from the plurality of interconnects, at least some solder interconnects from the plurality of solder interconnects, and at least some cap interconnects from the plurality of cap interconnects are configured to operate as an inductor.

13. The package of claim 1, further comprising:
a package substrate coupled to the plurality of encapsulation interconnects through a plurality of solder interconnects such that a back side of the acoustic device faces away from the package substrate; and
a second encapsulation layer coupled to the package substrate, the encapsulation layer, the polymer cap layer, the polymer frame and the acoustic device
wherein the plurality of encapsulation interconnects are coupled to the plurality of cap interconnects;
wherein the encapsulation layer is either below or above the polymer cap layer but not both below and above the polymer cap layer.

14. The package of claim 1, further comprising:
at least one dielectric layer coupled to the encapsulation layer;
a plurality of interconnects located at least in the at least one dielectric layer, wherein the plurality of interconnects are coupled to the plurality of encapsulation interconnects;
a package substrate coupled to the plurality of interconnects through a plurality of solder interconnects such that a back side of the acoustic device faces away from the package substrate; and
a second encapsulation layer coupled to the package substrate, the at least one dielectric layer, the encapsulation layer, the polymer cap layer, the polymer frame and the acoustic device;
wherein the plurality of encapsulation interconnects are coupled to the plurality of cap interconnects.

15. The package of claim 1, wherein the polymer frame includes a different material than the polymer cap layer.

16. The package of claim 1, wherein a minimum height of the cavity is about 4 micrometers.

17. The package of claim 1, wherein the acoustic device is configured to operate as a surface acoustic wave (SAW) filter or a bulk acoustic wave (BAW) filter.

18. A device comprising:
an acoustic device comprising:
a substrate; and
an acoustic element coupled to the substrate;
a polymer frame coupled to the acoustic device;
a plurality of frame interconnects located in the polymer frame, wherein the plurality of frame interconnects are coupled to the acoustic device;
a polymer cap layer coupled to the acoustic device through the polymer frame, wherein the polymer cap layer is configured as a cap for the acoustic device;
a plurality of cap interconnects located in the polymer cap layer, wherein the plurality of cap interconnects are coupled to the plurality of frame interconnects; and
a cavity located between the acoustic device and the polymer cap layer;
an encapsulation layer coupled to the polymer cap layer, wherein the encapsulation layer includes a material that is different from the polymer cap layer, and
wherein at least a portion of the polymer cap layer is located between the encapsulation layer and the polymer frame;
a plurality of encapsulation interconnects located at least in the encapsulation layer, where at least one encapsulation interconnect of the plurality of encapsulation interconnects is coupled to at least one of the cap interconnects of the plurality of cap interconnects.

19. The device of claim 18,
wherein at least some encapsulation interconnects of the plurality of encapsulation interconnects are configured to operate as an inductor.

20. The device of claim 19, wherein the encapsulation layer includes a magnetic material that has permeability of 1 or greater.

21. The device of claim 19, further comprising a magnetic inlay located in the encapsulation layer.

22. The device of claim 19, further comprising:
at least one dielectric layer coupled to the encapsulation layer; and
a plurality of interconnects located at least in the at least one dielectric layer, wherein the plurality of interconnects are coupled to the plurality of encapsulation interconnects.

23. The device of claim 19, further comprising:
a high K dielectric layer coupled to an encapsulation interconnect from the plurality of encapsulation interconnects;
at least one dielectric layer coupled to the encapsulation layer; and
a plurality of interconnects located at least in the at least one dielectric layer,
wherein the plurality of interconnects are coupled to the plurality of encapsulation interconnects,
wherein an interconnect from the plurality of interconnects is coupled to the high K dielectric layer, and
wherein the encapsulation interconnect, the high K dielectric layer and the interconnect are configured to operate as a capacitor.

24. The device of claim 18, wherein the acoustic device, the polymer frame and the polymer cap layer are part of a package.

25. The device of claim 18, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

26. A method for fabricating a package, comprising:
providing an acoustic device comprising:
   a substrate; and
   an acoustic element coupled to the substrate;
coupling a polymer frame to the acoustic device;
coupling a polymer cap layer to the acoustic device through the polymer frame,
   wherein coupling the polymer cap layer forms a cavity located between the acoustic device and the polymer cap layer, and
   wherein the polymer cap layer is configured as a cap for the acoustic device;
forming a plurality of frame interconnects in the polymer frame, wherein the plurality of frame interconnects are coupled to the acoustic device;
forming a plurality of cap interconnects in the polymer cap layer, wherein the plurality of cap interconnects are coupled to the plurality of frame interconnects;
coupling an encapsulation layer coupled to the polymer cap layer such that at least a portion of the polymer cap layer is located between the encapsulation layer and the polymer frame, where the encapsulation layer is different from the polymer cap layer;
forming a plurality of encapsulation interconnects at least in the encapsulation layer, where at least one encapsulation interconnect of the plurality of encapsulation interconnects is coupled to at least one of the cap interconnects of the plurality of cap interconnects.

27. The method of claim 26,
wherein at least some encapsulation interconnects of the plurality of encapsulation interconnects are configured to operate as an inductor.

28. The method of claim 27, further comprising providing a magnetic inlay located in the encapsulation layer.

29. The method of claim 27, further comprising:
forming at least one dielectric layer that is coupled to the encapsulation layer; and
forming a plurality of interconnects at least in the at least one dielectric layer, wherein the plurality of interconnects are coupled to the plurality of encapsulation interconnects.

30. The method of claim 27, further comprising:
forming a high K dielectric layer that is coupled to an encapsulation interconnect from the plurality of encapsulation interconnects;
forming at least one dielectric layer that is coupled to the encapsulation layer; and
forming a plurality of interconnects at least in the at least one dielectric layer,
   wherein the plurality of interconnects are coupled to the plurality of encapsulation interconnects,
   wherein an interconnect from the plurality of interconnects is coupled to the high K dielectric layer, and
   wherein the encapsulation interconnect, the high K dielectric layer and the interconnect are configured to operate as a capacitor.

* * * * *